United States Patent
Zhang et al.

(10) Patent No.: US 9,627,562 B2
(45) Date of Patent: Apr. 18, 2017

(54) METHOD OF MANUFACTURING A MONOLAYER GRAPHENE PHOTODETECTOR AND MONOLAYER GRAPHENE PHOTODETECTOR

(71) Applicant: Nanyang Technological University, Singapore (SG)

(72) Inventors: Yongzhe Zhang, Singapore (SG); Qijie Wang, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 14/766,064

(22) PCT Filed: Mar. 20, 2014

(86) PCT No.: PCT/SG2014/000138
§ 371 (c)(1),
(2) Date: Aug. 5, 2015

(87) PCT Pub. No.: WO2014/149004
PCT Pub. Date: Sep. 25, 2014

(65) Prior Publication Data
US 2016/0005894 A1   Jan. 7, 2016

Related U.S. Application Data

(60) Provisional application No. 61/804,322, filed on Mar. 22, 2013.

(51) Int. Cl.
*H01L 31/0352* (2006.01)
*H01L 31/028* (2006.01)
(Continued)

(52) U.S. Cl.
CPC ...... *H01L 31/035218* (2013.01); *B82Y 10/00* (2013.01); *B82Y 40/00* (2013.01);
(Continued)

(58) Field of Classification Search
None
See application file for complete search history.

(56) References Cited

U.S. PATENT DOCUMENTS

2013/0049738 A1* 2/2013 Sargent .......... H01L 31/035218
324/96
2014/0054442 A1* 2/2014 Huang ................... H01L 31/02
250/200
(Continued)

OTHER PUBLICATIONS

Konstantatos G et al., "Hybrid graphene-quantum dot phototransistors with ultrahigh gain", Nature Nanotechnology vol. 7, Jun. 2012, p. 363-368, DOI: 10.1038/NNAN0.2012.60, Published Online May 6, 2012.*

(Continued)

*Primary Examiner* — Michael Lebentritt
*Assistant Examiner* — Jordan Klein
(74) *Attorney, Agent, or Firm* — Seed IP Law Group LLP

(57) ABSTRACT

In various embodiments of the present disclosure, there is provided a method of manufacturing a monolayer graphene photodetector, the method including forming a graphene quantum dot array in a graphene monolayer, and forming an electron trapping center in the graphene quantum dot array. Accordingly, a monolayer graphene photodetector is also provided.

22 Claims, 11 Drawing Sheets

(51) Int. Cl.
| | |
|---|---|
| H01L 27/144 | (2006.01) |
| H01L 31/18 | (2006.01) |
| B82Y 40/00 | (2011.01) |
| H01L 31/113 | (2006.01) |
| B82Y 10/00 | (2011.01) |
| H01L 29/778 | (2006.01) |
| H01L 29/12 | (2006.01) |
| H01L 29/06 | (2006.01) |
| H01L 29/16 | (2006.01) |
| H01L 21/02 | (2006.01) |
| B82Y 30/00 | (2011.01) |

(52) U.S. Cl.
CPC ...... *H01L 27/1446* (2013.01); *H01L 29/0673* (2013.01); *H01L 29/127* (2013.01); *H01L 29/1606* (2013.01); *H01L 29/7781* (2013.01); *H01L 31/028* (2013.01); *H01L 31/1136* (2013.01); *H01L 31/1804* (2013.01); *H01L 31/186* (2013.01); *B82Y 30/00* (2013.01); *H01L 21/0259* (2013.01); *H01L 21/02527* (2013.01); *H01L 21/02664* (2013.01)

(56) References Cited

U.S. PATENT DOCUMENTS

| | | | | |
|---|---|---|---|---|
| 2014/0252316 | A1* | 9/2014 | Yan | C09K 11/02 257/24 |
| 2014/0264275 | A1* | 9/2014 | Zhong | H01L 31/028 257/21 |
| 2014/0299741 | A1* | 10/2014 | Colli | H01L 31/035218 250/200 |
| 2015/0129544 | A1* | 5/2015 | Davis | B82B 1/005 216/39 |
| 2015/0318401 | A1* | 11/2015 | Duan | H01L 29/66742 250/200 |
| 2015/0357189 | A1* | 12/2015 | Davis | H01L 21/28512 257/29 |

OTHER PUBLICATIONS

Singh V. et al., "Graphene based materials: Past, present and future", Progress in Materials Science, vol. 56, 2011, p. 1178-1271, DOI:10. 1016/j.pmatsci.2011.03.003, Published Online Apr. 3, 2011.*
Afsal et al., "Highly sensitive metal-insulator-semiconductor UV photodetectors based on ZnO/SiO$_2$ core-shell nanowires," *Journal of Materials Chemistry* 22:8420-8425, 2012.
Asif Khan et al., "Schottky barrier photodetector based on Mg-doped *p*-type GaN films," *Appl. Phys. Lett.* 63:2455-2456, 1993.
Bae et al., "Roll-to-roll production of 30-inch graphene films for transparent electrodes," *Nat. Nano.* 5:574-578, 2010.
Bai et al., "Rational Fabrication of Graphene Nanoribbons Using a Nanowire Etch Mask," *Nano. Lett.* 9:2083-2087, 2009.
Bai et al., "Graphene nanomesh," *Nat. Nano.* 5:190-194, 2010.
Bao et al., "Broadband graphene polarizer," *Nat. Photon.* 5:411-415, 2011.
Bell et al., "Precision cutting and patterning of graphene with helium ions," *Nanotechnology* 20:455301, 2009. (5 pages).
Beverly et al., "Effects of Size Dispersion Disorder on the Charge Transport in Self-Assembled 2-D Ag Nanoparticle Arrays," *The Journal of Physical Chemistry B* 106:2131-2135, 2002.
Boukhvalov et al., "Chemical Functionalization of Graphene with Defects," *Nano. Lett.* 8:4373-4379, 2008.
Breusing et al., "Ultrafast Carrier Dynamics in Graphite," *Phys. Rev. Lett.* 102:086809, 2009. (4 pages).
Cai et al., "Atomically precise bottom-up fabrication of graphene nanoribbons," *Nature* 466:470-473, 2010.
Chen et al., "Defect Scattering in Graphene," *Phys. Rev. Lett.* 102:236805, 2009. (4 pages).

Chen et al., "Optical nano-imaging of gate-tunable graphene plasmons," *Nature* 487:77-81, 2012.
Datskos et al., "Remote infrared radiation detection using piezoresistive microcantilevers," *Applied Physics Letters* 69:2986-2988, 1996.
Dayen et al., "Side-Gated Transport in Focused-Ion-Beam-Fabricated Multilayered Graphene Nanoribbons," *Small* 4:716-720, 2008.
Dresselhaus et al., "Perspectives on Carbon Nanotubes and Graphene Raman Spectroscopy," *Nano. Lett.* 10:751-758, 2010.
Echtermeyer et al., "Strong plasmonic enhancement of photovoltage in graphene," *Nat. Commun.* 2:458, 2011. (5 pages).
Ellingson et al., "Highly Efficient Multiple Exciton Generation in Colloidal PbSe and PbS Quantum Dots," *Nano. Lett.* 5:865-871, 2005.
Fei et al., "Gate-tuning of graphene plasmons revealed by infrared nano-imaging," *Nature* 487:82-85, 2012.
Furchi et al., "Microcavity-Integrated Graphene Photodetector," *Nano. Lett.* 12:2773-2777, 2012.
Gabor et al., "Extremely Efficient Multiple Electron-Hole Pair Generation in Carbon Nanotube Photodiodes," *Science* 325:1367-1371, 2009.
Gabor et al., "Hot Carrier-Assisted Intrinsic Photoresponse in Graphene," *Science* 334:648-652, 2011.
George et al., "Ultrafast Optical-Pump Terahertz-Probe Spectroscopy of the Carrier Relaxation and Recombination Dynamics in Epitaxial Graphene," *Nano. Lett.* 8:4248-4251, 2008.
Gómez-Navarro et al., "Electronic Transport Properties of Individual Chemically Reduced Graphene Oxide Sheets," *Nano. Lett.* 7:3499-3503, 2007.
Guo et al., "A nanocomposite ultraviolet photodetector based on interfacial trap-controlled charge injection," *Nat. Nanotech.* 7:798-802, 2012.
Güttinger et al., "Charge detection in graphene quantum dots," *Appl. Phys. Lett.* 93:212102, 2008. (4 pages).
Han et al., "Energy Band-Gap Engineering of Graphene Nanoribbons," *Phys. Rev. Lett.* 98:206805, 2007. (4 pages).
Hashimoto et al., "Direct evidence for atomic defects in graphene layers," *Nature* 430:870-873, 2004.
Jackson et al., "Infrared spectroscopy: a new frontier in medicine," *Biophysical Chemistry* 68:109-125, 1997.
Jiao et al., "Narrow graphene nanoribbons from carbon nanotubes," *Nature* 458:877-880, 2009.
Joung et al., "Coulomb blockade and hopping conduction in graphene quantum dots array," *Phys. Rev. B* 83:115323, 2011. (6 pages).
Karstad et al., "Detection of mid-IR radiation in sum frequency generation for free space optical communication," *Optics and Lasers in Engineering* 43:537-544, 2005.
Konstantatos et al., "Hybrid graphene-quantum dot phototransistors with ultrahigh gain," *Nat. Nano.* 7:363-368, 2012.
Kosynkin et al., "Longitudinal unzipping of carbon nanotubes to form graphene nanoribbons," *Nature* 458:872-876, 2009.
Krasheninnikov et al., "Engineering of nanostructured carbon materials with electron or ion beams," *Nat. Mater.* 6:723-733, 2007.
Kushwaha et al., "Defect induced high photocurrent in solution grown vertically aligned ZnO nanowire array films," *J. Appl. Phys.* 112:054316, 2012. (8 pages).
Lahiri et al., "An extended defect in graphene as a metallic wire," *Nat. Nanotech.* 5:326-329, 2010.
Lee et al., "Contact and edge effects in graphene devices," *Nat. Nano.* 3:486-490, 2008.
Lemme et al., "Gate-Activated Photoresponse in a Graphene p-n Junction," *Nano. Lett.* 11:4134-4137, 2011.
Liu et al., "A graphene-based broadband optical modulator," *Nature* 474:64-67, 2011.
Liu et al., "Plasmon resonance enhanced multicolour photodetection by graphene," *Nat. Commun.* 2:579, 2011. (7 pages).
Mak et al., "The evolution of electronic structure in few-layer graphene revealed by optical spectroscopy," *Proceedings of the National Academy of Sciences* 107:14999-15004, 2010.

(56) References Cited

OTHER PUBLICATIONS

Martins Ferreira et al., "Evolution of the Raman spectra from single-, few-, and many-layer graphene with increasing disorder," *Phys. Rev. B* 82:125429, 2010. (9 pages).
Moriyama et al., "Coupled Quantum Dots in a Graphene-Based Two-Dimensional Semimetal," *Nano. Lett.* 9:2891-2896, 2009.
Mueller et al., "Role of contacts in graphene transistors: A scanning photocurrent study," *Phys. Rev. B* 79:245430, 2009. (6 pages).
Mueller et al., "Graphene photodetectors for high-speed optical communications," *Nat. Photon.* 4:297-301, 2010.
Nair et al., "Fine Structure Constant Defines Visual Transparency of Graphene," *Science* 320:1308, 2008.
Nazin et al., "Visualization of charge transport through Landau levels in graphene," *Nat. Phys.* 6:870-874, 2010.
Ni et al., "Raman Spectroscopy and Imaging of Graphene," *Nano Research* 1:273-291, 2008.
Ni et al., "On Resonant Scatterers as a Factor Limiting Carrier Mobility in Graphene," *Nano. Lett.* 10:3868-3872, 2010.
Palacios et al., "Vacancy-induced magnetism in graphene and graphene ribbons," *Phys. Rev. B* 77:195428, 2008. (14 pages).
Park et al., "Imaging of Photocurrent Generation and Collection in Single-Layer Graphene," *Nano. Lett.* 9:1742-1746, 2009.
Ponomarenko et al., "Chaotic Dirac billiard in graphene quantum dots," *Science* 320:356-358, 2008.
Recher et al., "Quantum dots and spin qubits in graphene," *Condensed Matter—Mesoscale and Nanoscale Physics*, Apr. 13, 2010. (23 pages).
Reyes et al., "Reduction of persistent photoconductivity in ZnO thin film transistor-based UV photodetector," *Appl. Phys. Lett.* 101:031118, 2012. (5 pages).
Romero et al., "Coulomb Blockade and Hopping Conduction in PbSe Quantum Dots," *Phys. Rev. Lett.* 95:156801, 2005. (4 pages).
Schaller et al., "High Efficiency Carrier Multiplication in PbSe Nanocrystals Implications for Solar Energy Conversion," *Phys. Rev. Letters* 92:186601, 2004. (4 pages).
Sensale-Rodriguez et al., "Broadband graphene terahertz modulators enabled by intraband transitions," *Nat. Commun.* 3:780, 2012. (7 pages).
Seol et al., "Two-Dimensional Phonon Transport in Supported Graphene," *Science* 328:213-216, 2010.
Sheng, "Fluctuation-induced tunneling conduction in disordered materials," *Phys. Rev.* B 21:2180-2195, 1980.
Shi et al., "Plasmon Resonance in Individual Nanogap Electrodes Studied Using Graphene Nanocontrictions as Photodetectors," *Nano. Lett.* 11:1814-1818, 2011.
Singh et al., "Graphene based Materials: Past, present and future," *Progress in Materials Science* 56:1178-1271, 2011.
Soci et al., "ZnO Nanowire UV Photodetectors with High Internal Gain," *Nano. Lett.* 7:1003-1009, 2007.

Sols et al., "Coulomb Blockade in Graphene Nanoribbons," *Phys. Rev. Lett.* 99:166803, 2007. (4 pages).
Stauber et al., "Electronic transport in graphene: A semiclassical approach including midgap states," *Phys. Rev. B.* 76:205423, 2007. (10 pages).
Sukhovatkin et al., "Colloidal Quantum-Dot Photodetectors Exploiting Multiexciton Generation," *Science* 324:1542-1544, 2009.
Sun et al., "Ultrafast hot-carrier-dominated photocurrent in graphene," *Nat. Nano.* 7:114-118, 2012.
Tapasztó et al., "Tailoring the atomic structure of graphene nanoribbons by scanning tunneling microscope lithography," *Nat. Nanotech.* 3:397-401, 2008.
Terrones et al., "The role of defects and doping in 2D graphene sheets and 1D nanoribbons," *Reports on Progress in Physics, Physical Society* 75:062501, 2012. (31 pages).
Wang et al., "Ultrafast relaxation dynamics of hot optical phonons in graphene," *Appl. Phys. Lett.* 96:081917, 2010. (4 pages).
Waugh et al., "Measuring interactions between tunnel-coupled quantum dots," *Phys. Rev. B* 53:1413-1420, 1996.
Werle et al., "Near- and mid-infrared laser-optical sensors for gas analysis," *Optics and Lasers in Engineering* 37:101-114, 2002.
Winzer et al., "Carrier Multiplication in Graphene," *Nano. Lett.* 10:4839-4843, 2010.
Xia et al., "Ultrafast graphene photodetector," *Nat. Nano.* 4:839-843, 2009.
Xia et al., "Photocurrent Imaging and Efficient Photon Detection in a Graphene Transistor," *Nano. Lett.* 9:1039-1044, 2009.
Xu et al., "Photo-Thermoelectric Effect at a Graphene Interface Junction," *Nano. Lett.* 10:562-566, 2010.
Yadav et al., "A comparative study of ultraviolet photoconductivity relaxation in zinc oxide (ZnO) thin films deposited by different techniques," *J. Appl. Phys.* 111:102809, 2012. (6 pages).
Yakimov et al., "Long-range Coulomb interaction in arrays of self-assembled quantum dots," *Phys. Rev. B* 61:10868-10876, 2000.
Yazyev, "Magnetism in Disordered Graphene and Irradiated Graphite," *Phys. Rev. Lett.* 101:037203, 2008. (4 pages).
Zhang et al., "Understanding Change Transfer at PbS-Decorated Graphene Surfaces toward a Tunable Photosensor," *Adv. Mater.* 24:2715-2720, 2012.
Zhang et al., "Broadband high photoresponse from pure monolayer graphene photodetector," *Nature Communications* 4:1811, 2013.
Zheng et al., "Highly sensitive photodetector using porous silicon," *Appl. Phys. Lett.* 61:459-461, 1992.
Zhou et al., "Atomically localized plasmon enhancement in monolayer graphene," *Nat. Nano.* 7:161-165, 2012.
Pan, D. et al., "Hydrothermal Route for Cutting Graphene Sheets into Blue-Luminescent Graphene Quantum Dots," Adv. Mater. 22:734-738, 2010.

* cited by examiner

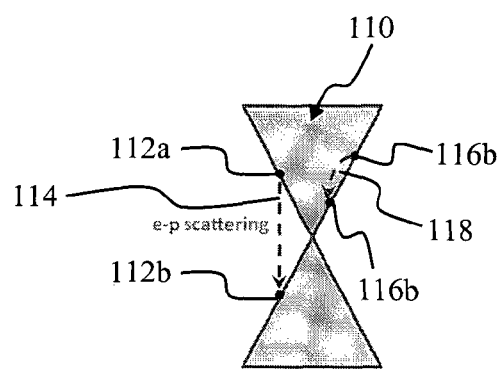
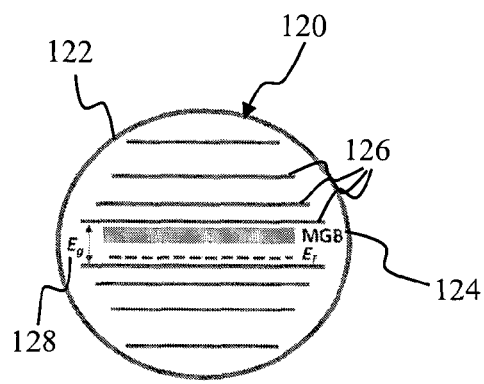
FIG. 1A  FIG. 1B
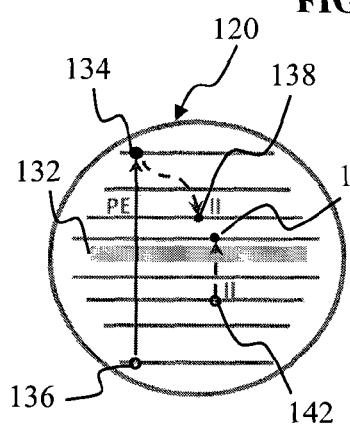
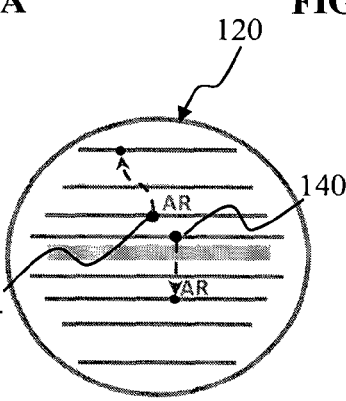
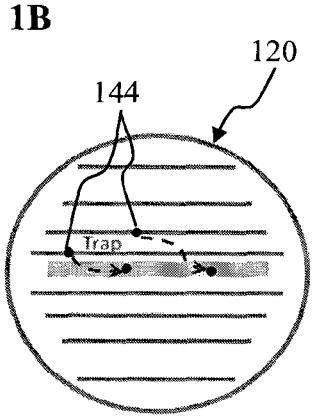
FIG. 1C  FIG. 1D  FIG. 1E
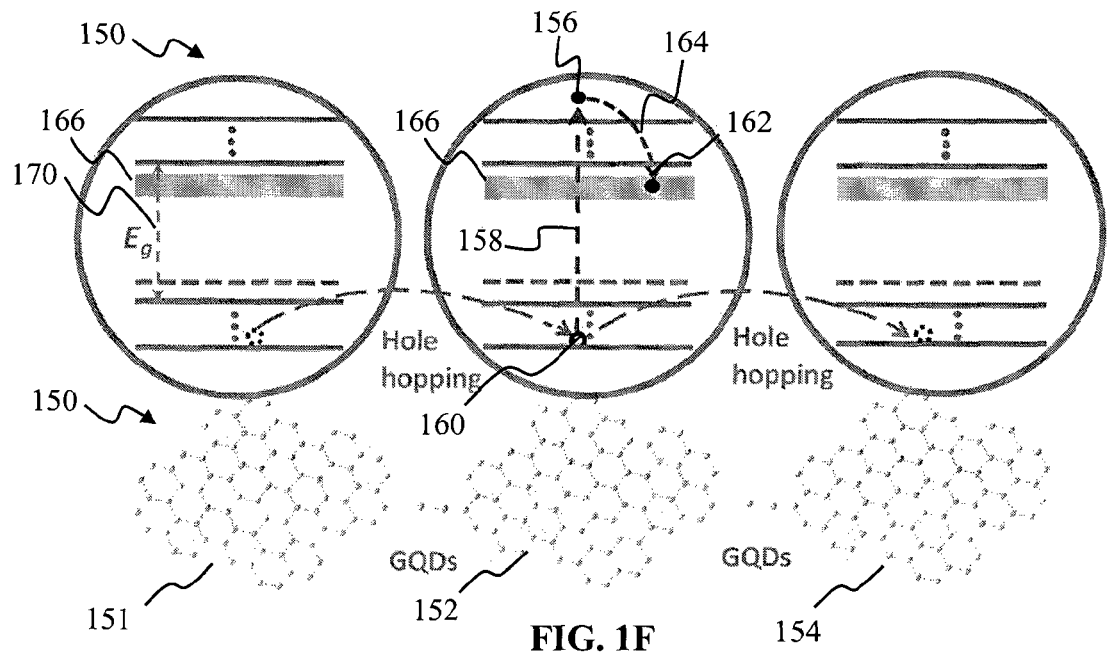
FIG. 1F

METHOD OF MANUFACTURING A MONOLAYER GRAPHENE PHOTODETECTOR AND MONOLAYER GRAPHENE PHOTODETECTOR

CROSS-REFERENCE TO RELATED APPLICATIONS

The present application claims the benefit of the U.S. provisional patent application No. 61/804,322, filed on 22 Mar. 2013, the entire contents of which are incorporated herein by reference for all purposes.

TECHNICAL FIELD

The present disclosure describes embodiments generally relating to a method of manufacturing a monolayer graphene photodetector. Further, a pure monolayer graphene photodetector is provided.

BACKGROUND

Graphene has recently attracted tremendous interests in photonic applications due to its promising optical properties, especially its ability in absorbing light over a broad wavelength range. Graphene, a two dimensional allotrope of carbon atoms on a honeycomb lattice with unique band structure, has recently attracted tremendous interests in photonic applications such as transparent electrodes, optical modulator, polarizer, surface plasmonics and photodetector. One of the better advantages of graphene is the ability to absorb about 2% of incident light over a broad wavelength range despite its thin one-atom layer thickness.

Several works have been previously reported on the realization of broadband graphene-based photodetectors in a field effect transistor (FET) structure. However, the highest responsivity, which can be defined as photo-generated current over per incident optical power, was determined to be lower than 10 mA/W. Although strategies such as using surface plasmons or microcavities have previously been adopted to enhance the performance of such graphene photodetectors, the responsivity obtained was still as low as several tens of milliamperes per watt. Further, such fabrication processes are complex.

In conventional graphene FET-based photodetectors, low responsivity is mainly attributed to the low optical absorption in monolayer graphene, of about 2.3%, and the short recombination lifetime, which is in the scale of picoseconds, of the photo-generated carriers, leading to a low internal quantum efficiency of about 6-16%. In addition, although pure monolayer graphene photodetectors have been predicted theoretically as to be having an ultra-wide band operation, all of the reported results based on presently provided pure monolayer graphene photodetectors did not demonstrate a broadband wavelength coverage range, e.g. from the visible to the mid-infrared.

SUMMARY

According to various embodiments in the present disclosure, there is provided a method of manufacturing a monolayer graphene photodetector, including forming a graphene quantum dot array in a graphene monolayer; and forming an electron trapping center in the graphene quantum dot array.

According to various embodiments in the present disclosure, there is provided a monolayer graphene photodetector, including a graphene quantum dot array formed on a graphene monolayer; and an electron trapping center formed in the graphene quantum dot array.

BRIEF DESCRIPTION OF THE DRAWINGS

In the drawings, like reference characters generally refer to the same parts throughout the different views. The drawings are not necessarily to scale, with emphasis instead generally being placed upon illustrating the principles of the present disclosure. It is to be noted that the accompanying drawings illustrate only examples of embodiments of this disclosure and are therefore not to be considered limiting of its scope, for the disclosure may admit to other equally effective embodiments. In the following description, various embodiments of the disclosure are described with reference to the following drawings, in which:

FIGS. 1A-1F illustrate energy band diagrams and schematic representation of various stages of carrier excitation and movement.

DETAILED DESCRIPTION

Figure 2B:
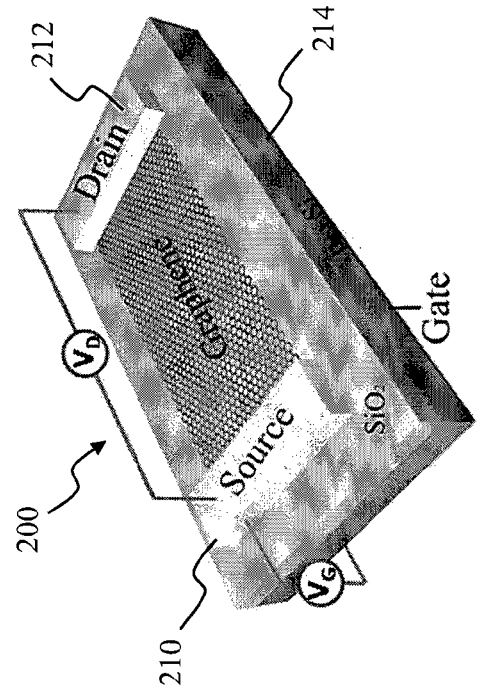
FIGS. 2A-2D illustrate various stages in the fabrication process for a pure graphene field-effect transistor (FET) based photodetector according to various embodiments.

Embodiments of a method of manufacturing a monolayer graphene photodetector and a monolayer graphene detector are described in detail below with reference to the accompanying figures. However, it should be understood that the disclosure is not limited to specific described embodiments. It will be appreciated that the embodiments described below can be modified in various aspects, features, and elements, without changing the essence of the disclosure. Further, any reference to various embodiments shall not be construed as a generalization of any inventive subject matter disclosed herein and shall not be considered to be an element or limitation of the appended claims except where explicitly recited in a claim(s).

According to various embodiments, depiction of a given element or consideration or use of a particular element number in a particular FIG. or a reference thereto in corresponding descriptive material can encompass the same, an equivalent, or an analogous element or element number identified in another FIG. or descriptive material associated therewith. The use of "/" herein means "and/or" unless specifically indicated otherwise.

The present disclosure can describe embodiments of a system or apparatus which can be operable in various orientations, and it thus should be understood that any of the terms "top", "bottom", "base", "down", "sideways", "downwards" etc., when used in the following description are used for convenience and to aid understanding of relative positions or directions, and not intended to limit the orientation of a system or apparatus. It is also noted that the term "distal" is used to indicate a location or a portion situated away from a point of origin and the term "proximal" is used to indicate a location or a portion situated toward the point of origin.

According to various embodiments, there is provided a method of manufacturing a monolayer graphene photodetector, including forming a graphene quantum dot array in a graphene monolayer; and forming an electron trapping center in the graphene quantum dot array.

As mentioned above, one of the better advantages of graphene is the ability to absorb about 2% of incident light over a broad wavelength range despite its thin one-atom layer thickness. This capability of graphene makes the realization of broadband graphene-based photodetectors possible, and furthermore, far exceeds the bandwidth of the currently provided photodetectors. In addition, graphene also shows high mobility which is promising for applications in ultrafast photodetection.

According to embodiments, in achieving high responsivity of the graphene photodetector, the absorption efficiency of graphene or the lifetime of the photo-excited carriers should be increased, while still maintaining the high mobility by modifying the properties of graphene.

According to various embodiments, an extraordinarily high photoresponse from pure monolayer graphene photodetector is realized by introducing electron trapping centers to increase the lifetime of the photo-excited carriers in graphene through bandstructure engineering. Bandgaps can be created in graphene, for example, by patterning graphene nanoribbon or nanomesh structures through electron beam lithography, nanowire shadow mask etching, block copolymer lithography and/or unzipping of carbon nanotubes for electronic applications.

In embodiments, various defect states can be created in graphene by defect engineering in manipulating electrical, chemical and magnetic properties of graphene. According to various embodiments, bandstructure engineering of graphene is explored to introduce a defect midgap states band (MGB) as well as a bandgap through a Titanium (Ti) sacrificial layer fabrication process so as to achieve a high photoresponse. After the fabrication, the graphene sheet forms graphene quantum dots-like array structure where the edge defects and the surface defects on these dots behave as electron trapping centers. According to embodiments, electron trapping centers are formed, in the bandstructure of the graphene quantum dot array, by creating a defect or defects on a surface or a boundary of the array. The photo-generated electrons are then captured by these surface defects trapping centers, assisted by a carrier multiexcitation generation (MEG) process, thus the lifetime of those carriers is increased.

In addition, in obtaining quantum dot-like structures, a bandgap can be created in graphene, which can efficiently reduce the electron-phonon scattering thus reducing the carrier recombination rate and increasing the electron capture probability in the trapping centers. The bandgap, as such, further facilitates an increase in the lifetime of photo-generated electron-hole pairs. As the lifetime of the photo-generated electrons increases, the corresponding photo-excited holes can be re-circulated multiple times through an external electrical field, by applying a source-drain voltage in a field-effect-transistor device before recombination. Doing so induces a photoconductive gain. In embodiments, through the above described processes, a responsivity of 8.61 A/W was achieved, which very favorably compares to the reported responsivities in present pure monolayer graphene photodetectors. Comparisons show that the pure monolayer graphene photodetector according to present embodiments achieves a responsivity of about three orders of magnitude higher.

Compared to other bandstructure engineering approaches, this method is simpler as the average size of graphene quantum dots can be controlled by adjusting the thickness of the Ti sacrificial layer, and a larger scale of device can be easily fabricated. The processes presented in the present disclosure may provide a new avenue for the development of graphene-based broadband high performance photodetectors and potentially other optoelectronic devices. In other embodiments, nanofabrication techniques such as e-beam lithography and focused-ion-beam, can also be used to fabricate broadband high photoresponse graphene-photodetectors. The operation principle of a fabricated graphene photodetector under such techniques bear no difference to that of a graphene photodetector fabricated under a sacrificial layer method according to various embodiments.

In addition to a high responsivity, embodiments of the present disclosure can demonstrate the broadest photoresponse wavelength range, from the visible (532 nm) up to the mid-infrared (~10 μm), in a single pure graphene photodetector. Further, the pure graphene photodetector also demonstrates operating with a photoconductive gain. This is the first demonstration that a photoconductive gain is achieved in a pure graphene photodetector. Photoconductive gain has been previously demonstrated with hybrid graphene photodetectors, for example graphene sheet doped with lead sulphide. While, the photoresponse of these hybrid graphene devices are comparable, the broadband advantage of the graphene is lost, i.e. the hybrid graphene photodetector cannot work in the important mid-infrared range. Compared with traditional mid-infrared photodetectors, such as a mercury cadmium telluride (HgCdTe or HCT) or quantum well infrared photodetector (QWIP), the pure graphene photodetector according to various embodiments has a lower cost and a lower operation power, and is compatible with existing complementary metal-oxide semiconductor (CMOS) semiconductor technologies while providing a high photoresponse.

FIG. 1A-1F illustrates energy band diagrams and schematic representation of various stages of carrier excitation and movement. According to various embodiments, the absorption efficiency of graphene is increased to increase or improve the photoresponsivity of pure graphene photodetectors. FIG. 1A shows a bandstructure diagram 110 of a pure graphene monolayer sheet. Under typical conditions, interband transition 114 accounts for the movement of an electron from 112a to 112b, and intraband transition 118 accounts for the movement of an electron from 116a to 116b. Such interband and intraband transitions can also be known as electron-phonon scatterings. For a pure graphene monolayer, it can be noted that the interband and intraband recombination rate, i.e. the time in which an electron loses energy and reoccupies the energy state of a corresponding electron hole, of the photogenerated electrons is very fast, in the range of a few picoseconds to a hundreds of femtoseconds.

The speed of the interband and intraband recombination can be regarded as one of the considerable factors in how no photoconductive gain has yet been attained in existing pure graphene sheets and photoconductors. This phenomenon is observed, i.e. where no multiplication effect has been experimentally observed in a pure graphene sheet, even though a carrier multi-excitation generation (MEG) process has been theoretically predicted, which projects an amplification factor of approximately four in view of the impact ionization process, or also known as the inverse Auger recombination process, in perfect graphene.

According to various embodiments in the present disclosure, a defect midgap states band (MGB) is introduced to pure graphene monolayer through bandstructure engineering to achieve a photoconductive gain. In various embodiments, a bandgap is introduced to pure graphene monolayer through bandstructure engineering to achieve a photoconductive gain. In various embodiments, a defect MGB and a bandgap is introduced to pure graphene monolayer through bandstructure engineering to achieve a photoconductive gain.

FIG. 1B-1F show energy diagrams and schematic representations of the electron multi-excitation generation and trapping and hole hopping in a graphene quantum dots (GQDs)-based photodetector under optical excitations, according to various embodiments. In order to introduce trapping centers, the graphene sheet is processed into GQD-like array structures, then the electron MGB trapping centers are formed on the boundary and surface of the GQDs.

FIG. 1B shows an energy diagram 120 of a graphene photodetector 120 according to embodiments. A trapping mid-gap band 124 is provided in between the energy level demarcations 126 in the energy diagram 120. $E_g$ indicates the quantum confined bandgap 128, and is understood to be the minimum energy required to excite an electron that is stuck in its bound state into a free state where it can participate in conduction. The bandgap 128 is the gap in energy between the bound state and the free state, between a valence band and conduction band. Therefore, the band gap 128 is the minimum change in energy required to excite the electron so that it can participate in conduction. $E_f$ 130 indicates the Fermi level.

Due to the bandgap 128 created in the GQDs system or array, the electron-phonon scattering rate decreases, which is beneficial to the carrier MEG processes such that more electrons can be generated and then trapped in the MGB.

According to various embodiments, the graphene photodetector includes one GQD array. In various embodiments, the graphene photodetector includes a plurality of GQD arrays, including a plurality of electron trapping centers or trapping bands. Although a singular GQD array would still allow functionality of the photodetector according to embodiments, an increase in the GQD arrays and electron trapping centers can provide for a more effective and efficient photodetector.

The sequence of the carrier MEG and trapping in MGB is depicted in FIGS. 1C-1E. FIG. 1C shows an energy diagram illustrating generation of an electron hole-pair via photoexcitation followed by the impact ionization (II) process. Electron 134 is transferred from a lower state to a more energetic state through a process of photoexcitation 132, in which the electron 134 is excited by photon absorption. In leaving the lower state, an electron hole 136 is left behind.

Thereafter, the photo-excited electron 134 relaxes to a lower energy state 138 within the conduction band. This is due to the excitation of a valence band electron 140 into the conduction band, leaving behind another electron hole 142. Such a process can be known as impact ionization II, or inverse Auger recombination.

FIG. 1D shows an energy diagram illustrating the Auger recombination process AR. The generation of two electrons 134, 140 brings an Auger recombination AR, where electron 140 is scattered from the conduction into the valence band, while simultaneously, the energy is transferred to electron 134, which is excited to a higher energy state within the conduction band.

Despite the competing processes between impact ionization and Auger recombination, impact ionization can be more efficient than the Auger recombination process in quantum-confined systems because of the asymmetry between impact ionization and Auger recombination. Therefore, carrier multiplication or an MEG effect occurs and more secondary electrons 144 are generated within the conduction band, which can then be captured by the MGB 124, and which enhances the electron generation efficiency. FIG. 1E shows an energy diagram where a trapping process of excited electrons to the MGB takes place.

It is noted that holes can also contribute to the carrier MEG process, assisted by an external electrical field. FIG. 1F shows a close-up view of a graphene photoconductive channel 150 including a plurality of graphene quantum dots array structures 151, 152, 154.

$E_g$ 170 denotes the bandgap which is formed in the GQD-based photodetector. An electron 156 is shown to be photo-excited 158 to a higher energy state, leaving behind an electron hole 160. The electron 156 is thereafter dropped to a lower state 162 due to impact ionization 164, and is captured by the MGB 166, the electron 156 having a relatively long lifetime. Before the trapped electron 156 can be recombined, the corresponding electron hole or photo-excited hole 160 can be circulated multiple times in the photoconductive channel 150, thereby achieving a photoconductive gain. In other words, when the photogenerated and the secondary-generated electrons are trapped in the MGB, the related holes can be recirculated many times through hopping within the lifetime of the MGB trapped electrons. Based on the above, it can be expected that a high photoresponse can be achieved for GQD-based photodetectors, in which electrons are trapped by the defect states, assisted by the electron and hole impact ionizations.

FIGS. 2A-2D illustrate various stages in the fabrication process for a pure graphene field-effect transistor (FET) based photodetector 200 according to various embodiments.

In embodiments, a pure graphene photodetector in a FET structure can be fabricated through a titanium etching fabrication method. In FIG. 2A, the photodetector 200 includes a substrate 202, providing a foundation upon which various elements of the photodetector 200 can be fabricated on. In various embodiments, the substrate 202 can be a double-layered substrate, and in embodiments, the substrate 202 includes a silicon dioxide ($SiO_2$) layer 204 provided over a doped silicon base layer 206. In various embodiments, the silicon base layer 206 is a degenerately doped or highly doped silicon base layer. In various embodiments, the silicon base layer 206 can include any one of a n-type or a p-type silicon. In embodiments, the photodetector 200 includes a substrate 202 which includes a silicon dioxide layer 204 being provided over highly-doped p-type silicon 206. In embodiments, the substrate is a 285-nm $SiO_2$/Si substrate. According to various embodiments, the silicon is a low-doped p-type silicon. In other embodiments, the silicon is a low-doped n-type silicon.

In various embodiments, a graphene monolayer 208 is provided over or on the substrate 202. Such a monolayer 208 can be considered to be a single atomic plane of graphite, and can be deposited on the substrate 202 through various fabrication techniques. In an embodiment, a micromechanical exfoliation technique is utilized to deposit the graphene monolayer 208. In embodiments, chemical vapor deposition or any other applicable fabrication technique can also be used to deposit the graphene monolayer. In embodiments, graphene flakes are mechanically exfoliated from natural graphite with tape. Monolayer graphene flakes can then be identified using optical microscopy and Raman spectroscopy.

In FIG. 2B, the substrate is provided with electrodes. Two electrode terminals, the source terminal 210 and the drain terminal 212 are formed by photolithography and lift-off techniques on top of the graphene monolayer 208 and the silicon substrate 202. The electrodes 210, 212 are formed in fabricating the FET photodetector 200. According to various embodiments, the electrodes can be titanium/gold electrodes. In embodiments, the electrodes are titanium/gold electrodes with a 20 nm thick titanium layer and a 80 nm thick gold layer. In embodiments, an argon/hydrogen (Ar/$H_2$) annealing is applied at 400° C. for two hours to clean the photoresist. Further, a gate terminal 214 is fabricated on base of the FET photodetector 200, on the bottom of the doped silicon base layer 206. In the FET photodetector, a voltage at the gate $V_G$ can control the current between the source 210 and the drain 212, as well as the voltage $V_D$.

Figure 2D:
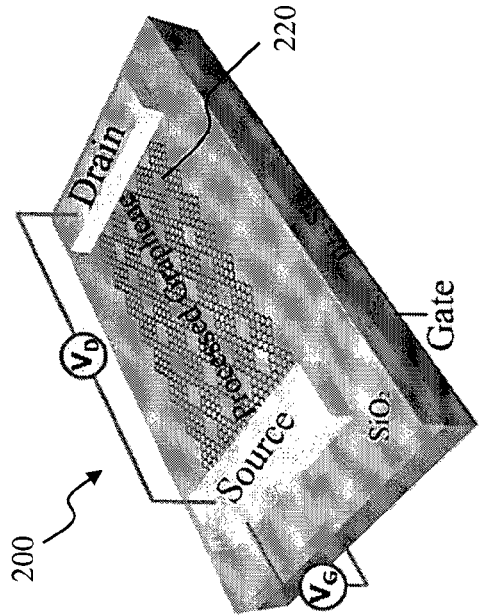
Figure 2A:
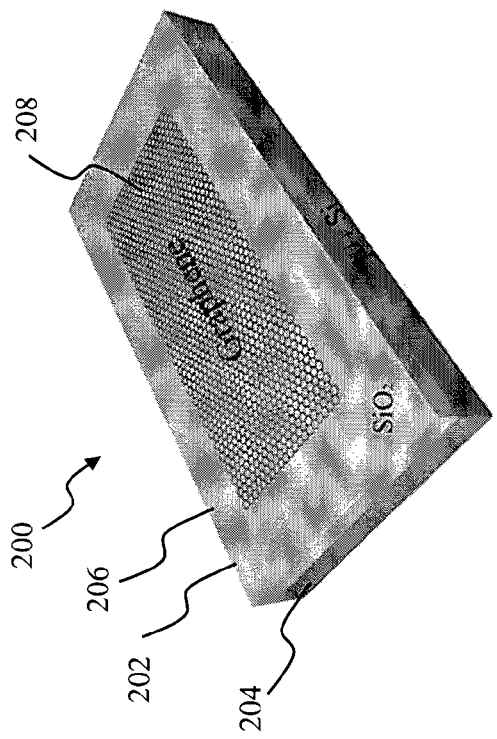
Figure 2C:
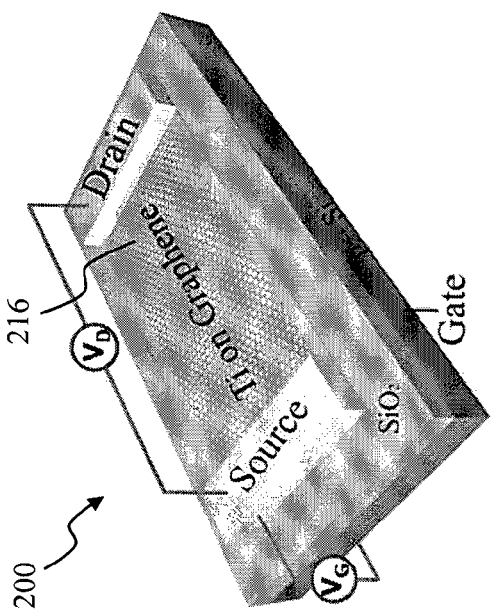

In FIG. 2C, titanium is provided on the photodetector 200. In embodiments, a titanium sacrificial layer 216 is deposited by electron-beam evaporation on the graphene monolayer 208. In embodiments, the titanium layer 216 is a thin layer, and the thin layer can range in thickness from 1 nm, 2 nm, 4 nm, 8 nm, 10 nm, 20 nm, 40 nm, or any other thickness which is applicable in the formation of defect structure engineering.

In FIG. 2D, the photodetector is provided with a graphene quantum dots structure. According to various embodiments, the titanium sacrificial layer 216 is removed with wet etching, and a processed graphene layer 220 can be formed on the substrate 202. The processed graphene layer 220 includes a plurality of graphene dots formed as part of a graphene quantum dot structure array. In embodiments, various sizes of graphene dots can be formed, depending on the thickness of the sacrificial titanium layer 216. In embodiments, the titanium layer 216 is removed with hydrofluoride (HF), hydrogen peroxide ($H_2O_2$) and deionized water with a volume ratio of 1:1:200, to form the quantum dot array structure 220. In embodiments, the etching rate is provided at about 20 nm/min. The provision of the graphene quantum dot array structure 220 completes the fabrication of the FET-based photodetector 200.

Figure 3A:
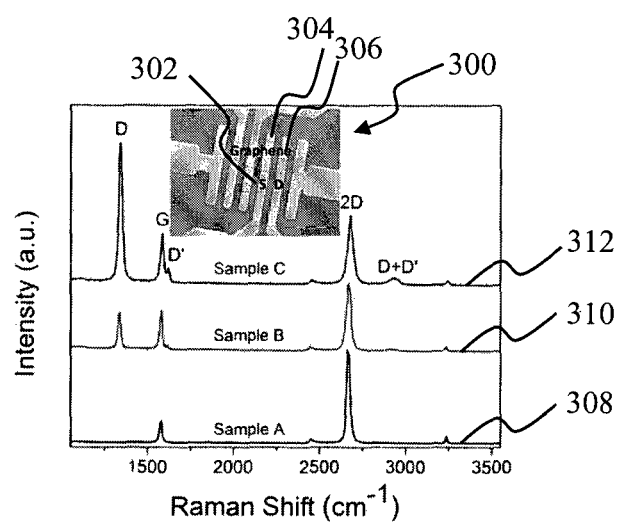
FIGS. 3A-3C illustrate testing results of embodiments of a photodetector according to various embodiments.
Figure 3B:
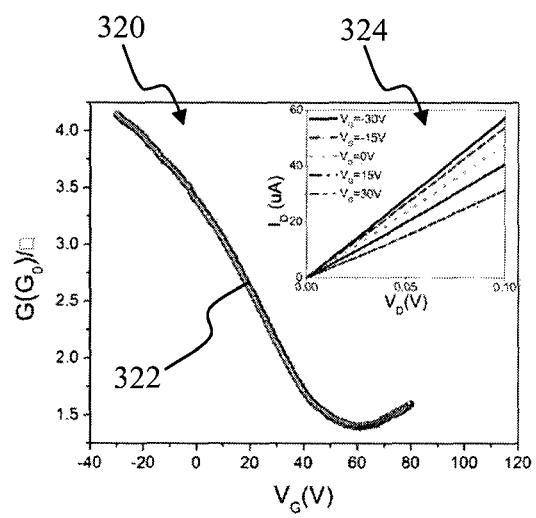
Figure 3C:
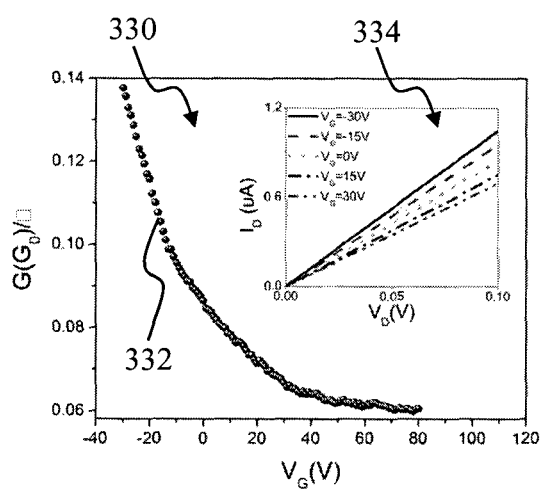

FIGS. 3A-C illustrate testing results of embodiments of a photodetector according to various embodiments. FIG. 3A shows Raman spectra readings. Raman spectra measurements are used to characterize the density of defects on the pristine graphene and the GQD structure after titanium etching of the graphene monolayer. A microscopic blown-up portion of a fabricated FET-based graphene photodetector 300 is provided inset into FIG. 3A. In embodiments, a graphene monolayer 302 is shown to be provided over a silicon substrate. According to various embodiments, the graphene monolayer 302 is fabricated through the mechanical exploitation method, and is resultantly provided as a trapezium-shaped overlay over the silicon substrate. In embodiments, the size of the graphene monolayer 302 is about 20 µm×10 µm. Source electrodes 304 and drain electrodes 306 are provided over the graphene monolayer 302, and provide the terminals for FET operation of the photodetector 300.

In embodiments of the present disclosure, the graphene monolayer is a pristine graphene sample which does not include any defects or GQD array and is denoted as Sample A. In embodiments, the graphene monolayer is processed with a 2 nm titanium layer in providing a GQD structure in the graphene, and is denoted as Sample B. In embodiments, the graphene monolayer is processed with a 20 nm titanium layer in providing a GQD structure in the graphene, and is denoted as Sample C. Hereinafter, a processed graphene detector can be understood to include a GQD array structure or defects. The Raman spectra of Sample A is provided as 308, the Raman spectra of Sample B is provided as 310, and the Raman spectra of Sample C is provided as 312.

In 308, for the pristine graphene sample, the G band and the 2D band are shown as at 1578 $cm^{-1}$ and 2666 $cm^{-1}$ respectively. In 310, for the graphene GQD structure processed with the 2 nm titanium layer, and in 312, for the graphene GQD structure processed with the 20 nm titanium layer, three defect-related Raman peaks are excited, namely D, D' and D+D', and are located around 1338 $cm^{-1}$, 1620 $cm^{-1}$ and 2934 $cm^{-1}$, respectively. The D and D' peaks originate from double-resonance processes at the K point in the presence of defects, involving respectively intervalley (D) and intravally (D') phonons. A higher number of defects were observed in Sample C than in Sample B, from the Raman $I_D/I_G$ ratio (where $I_D$ and $I_G$ are the D-band and G-band Raman intensities, respectively). It is noted that the Raman $I_D/I_G$ ratio is widely used to evaluate the quality of graphene materials.

It can be observed that there are no defect states in Sample A, showing that it is indeed a pristine sample. Further, Sample C has the largest number of defect states as the ratio of the D-band and the G-band Raman intensities is the highest. In embodiments, the average crystallite size of the GQDs can be estimated by using the following equation:

$$L_a(nm)=(2.4\times10^{-10})\lambda(nm)^4(I_D/I_G)^{-1} \qquad (1)$$

where $L_a$ is the average crystallite size of the graphene dots, and λ=532 nm is the wavelength of the Raman signal. A value of about 7.5 nm was obtained for sample C. According to various embodiments, the graphene sheet in the FET channel, including numerous graphene quantum dots, can be considered with an average size of about 7.5 nm.

FIG. 3B illustrates the electrical characteristics of Sample A. Graph 320 shows the electrical characteristics 322 of Sample A as a function of the gate voltage transfer curve. The inset 324 shows a plurality of current-voltage (I-V) curves of this Sample A under varying gate voltages. For the pristine graphene sample, the transfer curve 322 shows an ambipolar transfer property, and where the Dirac point occurs at $V_G$~60V.

FIG. 3C illustrates the electrical characteristics of Sample C. Graph 330 shows the electrical characteristics 332 of Sample A as a function of the gate voltage transfer curve. The inset 334 shows a plurality of current-voltage (I-V) curves of this Sample C under varying gate voltages. As can be observed for the processed graphene of Sample C, the ambipolar transfer property for Sample C is shifted to about where $V_G$~80V. According to various embodiments, after the defects are introduced, the on-state electrical conductance of the FET-based photodetector decreases. In embodiments, electrical testing shows that the electrical conductance can decrease to about 0.14 $G_0$.

According to various embodiments, the graphene photodetector can be fabricated to achieve graphene quantum dots with a processing of a 20 nm titanium layer, deposited on the graphene monolayer by electron beam evaporation and removed through wet etching. FIGS. 4A-4E illustrate electrical testing results of an embodiment of a photodetector according to various embodiments. The carrier transport properties of the processed graphene sample are investigated, with respect to the electrical properties at different temperatures.

Figure 4A:
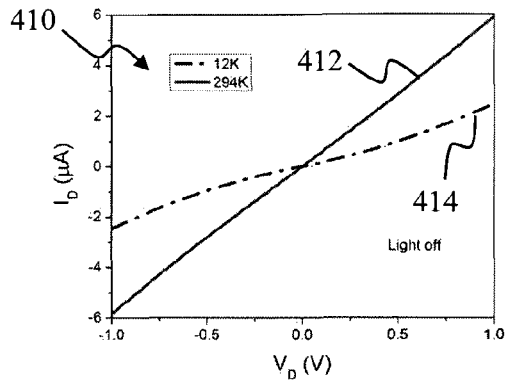
FIGS. 4A-4E illustrate electrical testing results of an embodiment of a photodetector according to various embodiments.

FIG. 4A shows the I-V characteristics of the graphene photodetector. Graph 410 shows the I-V characteristics 412 of the graphene photodetector at 294K and the I-V characteristics 414 of the graphene photodetector at 12K. I-V characteristics 412 can be observed to be linear at 294K, in the bias ranges from −1V to 1V for $V_D$. At a low temperature of 12 K, the I-V characteristics 414 become remarkably nonlinear and highly symmetric, and the conductance reduces at low biases. These phenomena can indicate that a barrier is formed when carriers transport in the GQDs.

The above phenomenon can be understood to be caused by the Coulomb blockade of charges, where the charges do not have enough energy to overcome Coulomb charging energies of quantum dots at low temperatures. It can be noted that the Schottky barrier formed between the contact and the graphene layer could also generate a current decrease at a low bias. However, according to embodiments, the Schottky barrier effect seems to be excluded because it would also introduce a nonlinear effect at room temperature and an asymmetric behavior at low temperatures, which are not observed in measurement results. In sum, this should show that the observed phenomena come from the graphene FET channel.

Figure 4B:
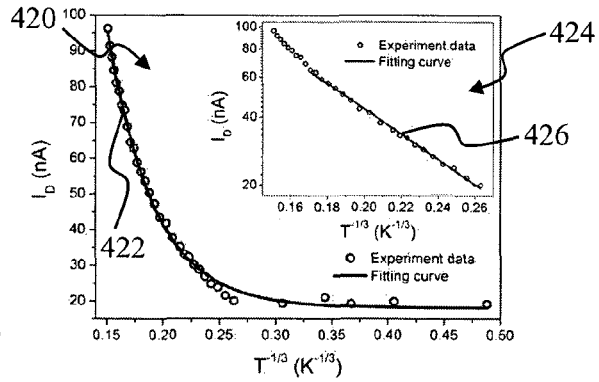

In order to further understand the electron transport mechanism of the processed graphene photodetector, the temperature dependence of the conductivity is explored. FIG. 4B shows the temperature dependence of the conductivity of the graphene photodetector. Graph 420 shows current (I) vs. temperature (T) (I-T) characteristics 422 of the graphene photodetector. The I-T characteristics are obtained and plotted on graph 420 for a temperature range from 8-290K. The best fit of the temperature dependent data was obtained with a $T^{-1/3}$ curve fitting or scale. The results can be understood to show that variable range hopping (VRH) is the main carrier transport mechanism, which involves consecutive hopping process between two localized states and is frequently observed in disordered systems including carbon related materials.

Further analysis shows that the overall temperature-dependent electrical conductance of the graphene photodetector as observed in I-T characteristics 422 can be expressed as:

$$I(T) = I_1 \exp\left(-\frac{B}{T^{-1/3}}\right) + I_0 \qquad (2)$$

where the first term represents the usual 2-dimensional VRH conduction and the second term represents purely the field-driven conduction without thermal activation.

According to the QDs array model, if QDs are monodispersed, the temperature dependence of current should follow thermally activated behavior $I(T)=I_1\exp(-E_0/k_BT)$. Further, if the nanocrystals have significant size variation (polydispersed), it should follow the variable range hopping (VRH) mechanism. The I-T characteristics 422 are re-plotted in logarithmic scale and provided in the inset 424 as curve 426. The curve can show that the transport current of the processed graphene device satisfies Equation (2) as a good linear fitting is obtained. According to various embodiments, this suggests that the processed device consists of numerous polydispersed GQDs.

Figure 4C:
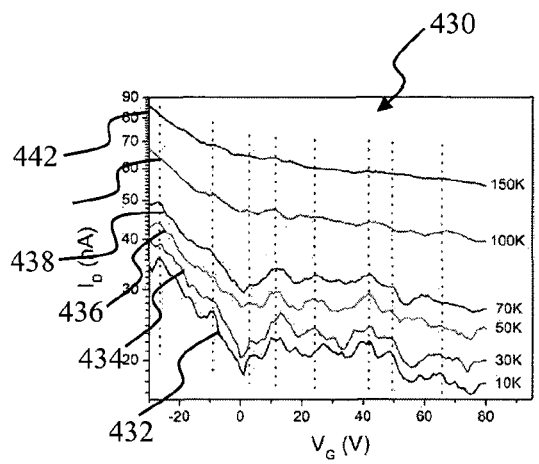

In order to further study the Coulomb blockade effect in the processed graphene device, the temperature dependent transfer curves are explored. FIG. 4C shows temperature dependent transfer curves of the graphene photodetector. Graph 430 shows transfer curves obtained at various temperatures, provided as follows: curve 432 for 10K, 434 for 30K, 436 for 50K, 438 for 70K, 440 for 100K, 442 for 150K. From observation, relatively strong temperature dependence is shown.

It can be observed that obvious oscillations appear in the transfer curves at low temperatures and these oscillation peaks are gradually broadened with an increase in temperature and disappear when the temperature is higher than 150 K. Similar Coulomb blockade effects have also been found in traditional colloidal quantum dots film. The different peak values and the broadening of the peaks should be attributed to polydispersed GQDs in the processed graphene photodetector, which can be taken to be in agreement with the results as obtained in FIG. 4B.

Figure 4D:
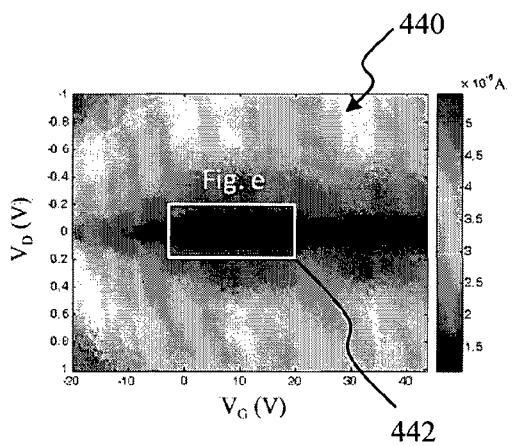

In order to obtain the charge energy of the GQDs in the processed graphene photodetector, differential conductance is explored. FIG. 4D shows a plot of differential conductance of the graphene photodetector according to embodiments. Graph 440 includes measurements of differential conductance (dI/dV) as functions of $V_G$ and $V_D$. The measurements are taken at a temperature of 12K, according to an embodiment.

Figure 4E:
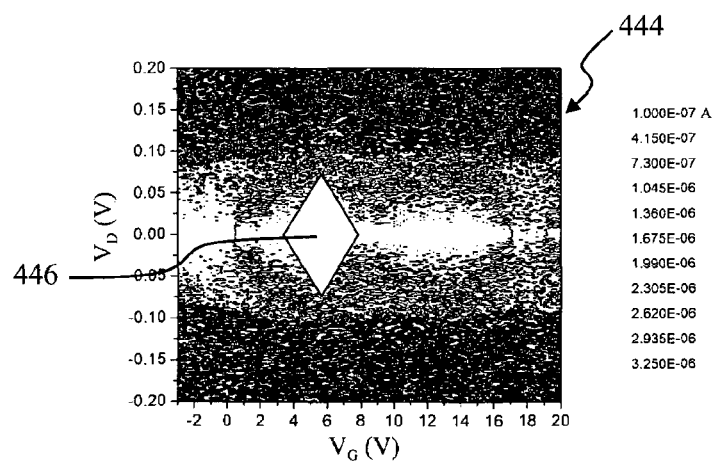

FIG. 4E shows a magnification plot of a portion of FIG. 4D. Graph 444 is a magnification plot of the region 442 in FIG. 4D. A diamond-shaped low-current region can be observed at 446, which can suggest that a Coulomb blockade effect of charges accounts for carrier transport, as described above. By calculating the height of the diamond-shape region 446, a transport gap (or mobility gap) of about 75 meV can be extrapolated. Previously, from the Raman measurements, an average size of the GQDs was calculated to be about 7.52 nm. The energy band gaps can then be estimated by the following:

$$E_g \approx \frac{hv_F}{W}, \text{ where } v_F \approx \frac{10^6 \text{ m}}{\text{s}} \qquad (3)$$

This can result in an energy band gap of about 88 meV being obtained, which can be understood to be in good agreement with the results in FIG. 4E.

FIGS. 5A-5H illustrate photoresponse measurement characteristics of graphene photodetectors according to various embodiments. To characterize the photoresponse characteristics of the pristine and the processed graphene devices, measurements were performed at 20 mV source-drain bias and zero gate voltage, with an illumination on the whole device at low temperatures.

Figure 5A:
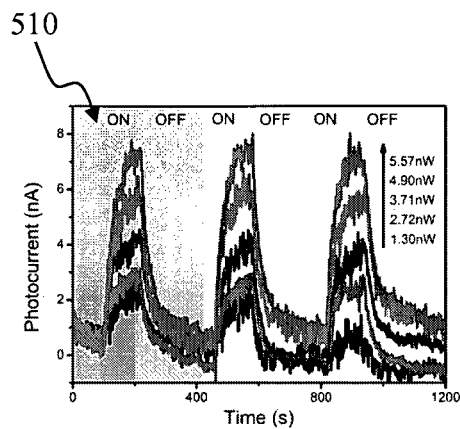
FIGS. 5A-5H illustrate photoresponse measurement characteristics of graphene photodetectors according to various embodiments.

FIG. 5A shows a time dependent photocurrent measurement of a graphene photodetector according to an embodiment. Graph 510 shows measurement results when the graphene photodetector is exposed to a light source providing a light with a wavelength in the visible region (532 nm). Multiple measurements are obtained, with respect to varying power intensities of the provided light. The photocurrent can also be observed to increase in intensity with respect to the increase in power of the light source.

Figure 5B:
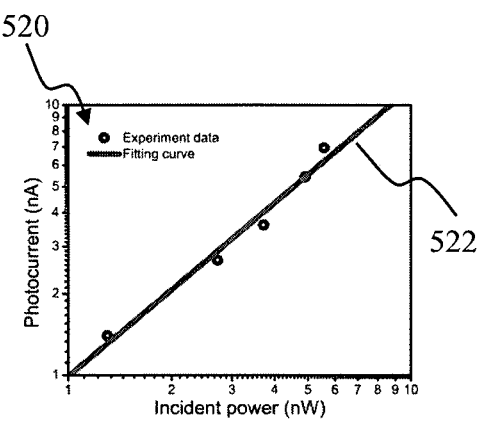
Figure 5C:
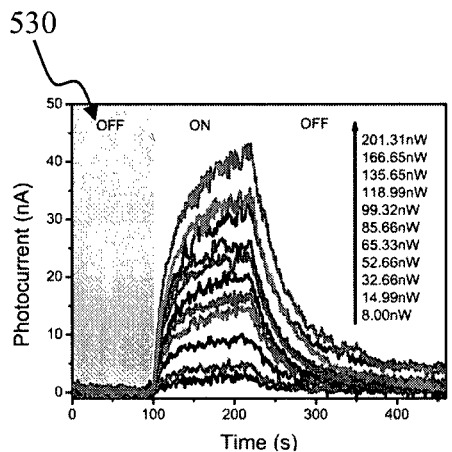

FIG. 5C shows a time dependent photocurrent measurement of a graphene photodetector according to an embodiment, with respect to a near-infrared light source. Graph 530 shows measurement results when the graphene photodetector is exposed to a light source providing a light with a wavelength in the near-infrared region (1.47 μm). The photocurrent can also be observed to increase in intensity with respect to the increase in power of the light source.

Figure 5D:
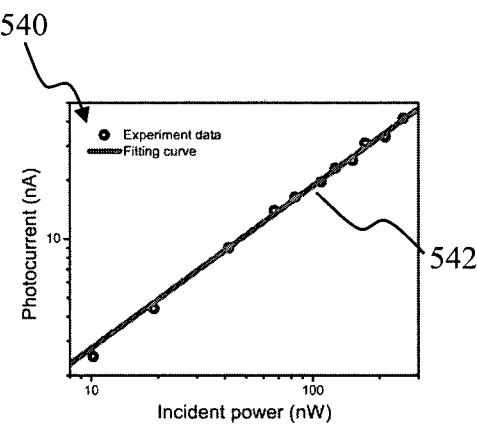
Figure 5E:
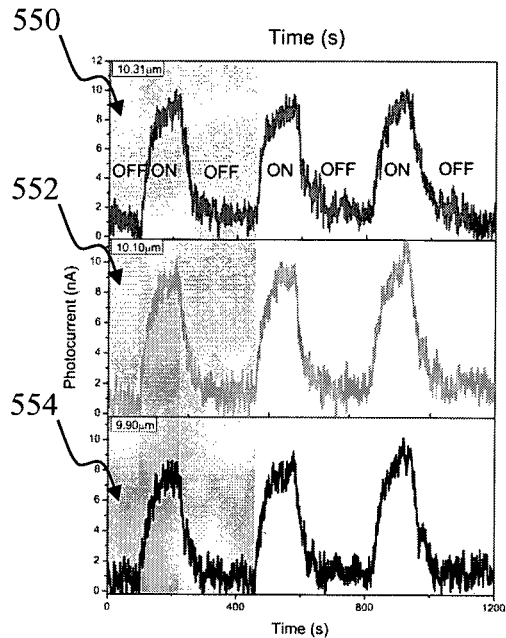

FIG. 5E shows a time dependent photocurrent measurement of a graphene photodetector according to an embodiment, with respect to a mid-infrared light source. Graphs 550, 552, and 554 show measurement results when the graphene photodetector is exposed to a light source providing a light with a wavelength in the mid-infrared region, and at 10.31 μm, 10.1 μm and 9.9 μm respectively.

As can be observed, the graphene quantum dots array-based photodetector according to various embodiments show high photoresponsivity in the tested wavelength ranges: ~1.25 A/W, 0.2 A/W and 0.4 A/W in the visible, near-infrared and mid-infrared ranges, respectively. These values are about 2-3 orders higher than those reported in literature based on simply pure monolayer graphene photodetectors, without any GQD defect engineering modification.

Figure 5F:
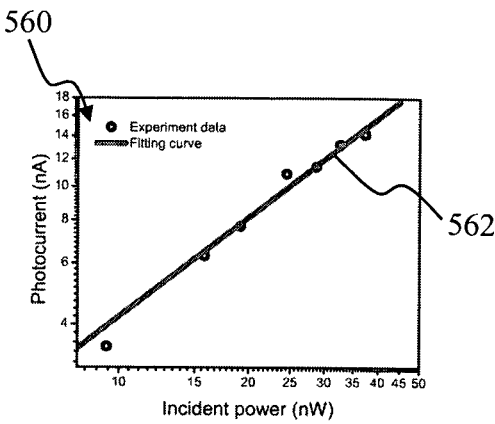

FIGS. 5B, 5D and 5F show the power dependence of the photocurrents in the visible, near-infrared and mid-infrared ranges, respectively. Graphs 520, 540 and 560 chart the photocurrents 522, 542 and 562, provided by curve fitting, with respect to incident power of the light received by the photodetector. The axes of graphs 520, 540 and 560 are in the logarithmic scale. It can be observed from graphs 520, 540 and 560 that the graphene photodetector according to various embodiments possess a high sensitivity property, capable of detecting a nW-level optical power input.

From the measurements, it can be shown that the photoresponse can be expressed by a power law $I_{pc} \propto P^\gamma$, where $I_{pc}$ is the photocurrent and $P^\gamma$ is the incident power of the illumination. For the visible, near-infrared and mid-infrared illuminations, γ is 1.07, 0.83 and 0.95, respectively. Generally, the non-unity exponential is a result of the complex processes of electron-hole generation, trapping and recombination, which can imply complex MGB electron trapping centers and carrier transport in the processed graphene photodetector.

Figure 5G:
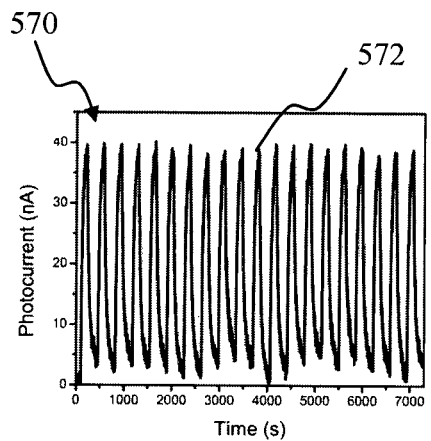

FIG. 5G shows a graph 570 with a time dependent photocurrent measurement 572 over a 20-periods on-off operation under a near-infrared light (1.47 μm) illumination, demonstrating the reliability of the photodetector.

Figure 5H:
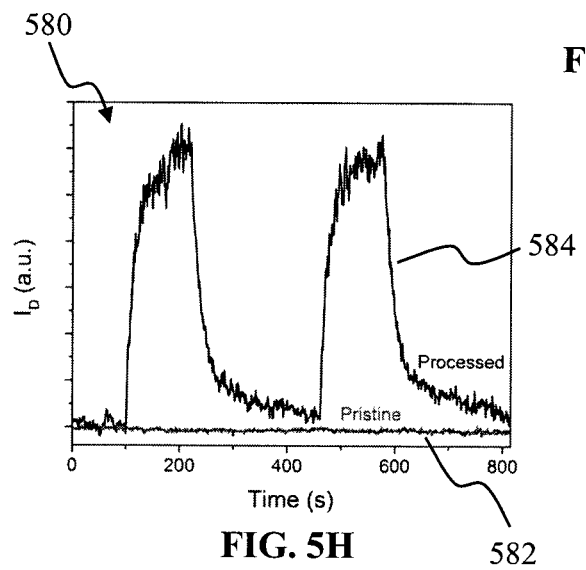

FIG. 5H illustrates a photoresponse measurement comparison of graphene photodetectors according to various embodiments. Optical responsivity of the pristine graphene sample without any defects or GQD array is charted in graph 580 as reading 582. The optical responsivity of the processed graphene sample, as processed with a 20 nm titanium layer in providing a GQD structure in the graphene, is charted as reading 584. According to embodiments, the responsivities of the two devices were measured under the excitation of a 532 nm laser, with a beam spot size of ~2 mm×~3 mm and an optical power of 38 mW.

As can be seen, little to no obvious photoresponse is shown for the pristine graphene device in 602. This agrees with previous reports, in which provides that a low responsivity of about 10 mA/W was reported under extremely high optical excitation of about $10^8$ mW/cm$^2$. Conversely, 604 shows extensive responsivity for the processed graphene device under similar light excitation.

Figure 6A:
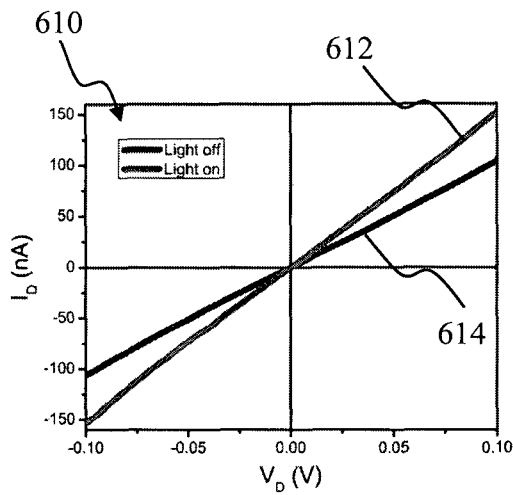
FIG. 6A illustrates the bias dependence of the photoresponse of a graphene photodetector according to an embodiment.

FIG. 6A illustrates the bias dependence of the photoresponse of a graphene photodetector according to an embodiment. Graph 610 shows the I-V curve of the processed graphene photodetector with a 532 nm illumination input 612 and without an optical excitation input 614. When the bias increases from zero to 0.1 V, the photoresponsivity increases from zero to 8.61 A/W accordingly. Such an occurrence can indicate that the generated photoresponse arises from a photoconductive effect rather than a photovoltaic effect.

Figure 6B:
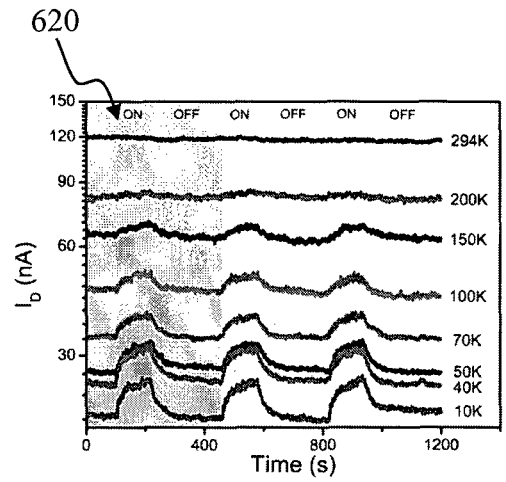
FIG. 6B illustrates time-dependent photocurrent measurements at different temperatures under visible light illumination for a graphene photodetector according to an embodiment.
Figure 6C:
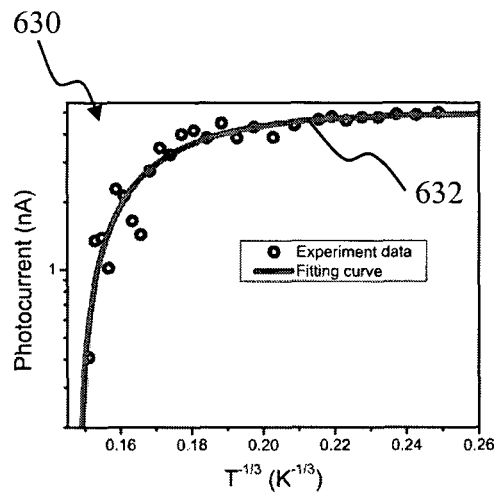
FIG. 6C illustrates temperature dependence of the photocurrent of the processed graphene photodetector according to embodiments.
Figure 6D:
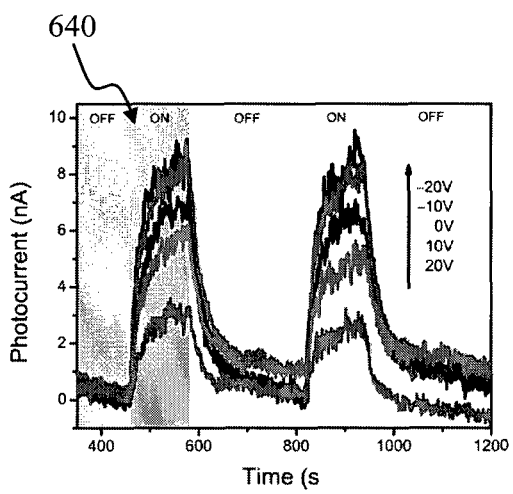
FIG. 6D illustrates time-dependent photocurrent measurements of the graphene photodetector at different gate voltages.

FIG. 6B illustrates time-dependent photocurrent measurements at different temperatures under visible light illumination for a graphene photodetector according to an embodiment. Graph 620 provides a plurality of measurement readings with respect to operating temperature. FIG. 6C illustrates temperature dependence of the photocurrent of the processed graphene photodetector according to embodiments. Graph 630 shows a curve fitted line 632 for a plurality of experimental data readings. FIG. 6D illustrates time-dependent photocurrent measurements of the graphene photodetector at different gate voltages. Graph 640 shows a plurality of measurements with respect to a variation in gate voltage.

Temperature dependent characteristics of the graphene photodetector according to various embodiments are thus shown in graphs 620, 630 and 640. Graphs 620 and 630 show a dependence of the temperature on the photoresponse of the detector. When the GQDs array photodetector is illuminated, electrons are excited to the conduction band and some of them are captured by the MGB states, assisted by the carrier MEG. It can be observed that the processed graphene photodetector provides a photoconductive gain, as discussed above.

Graphs 620 and 630 also show that the photoresponse decreases with an increase in temperature. This could be explained by a faster recombination of captured electrons in the MGB states occurring with the increase of temperature, and which thus reduces the photoresponse accordingly.

Figure 7A:
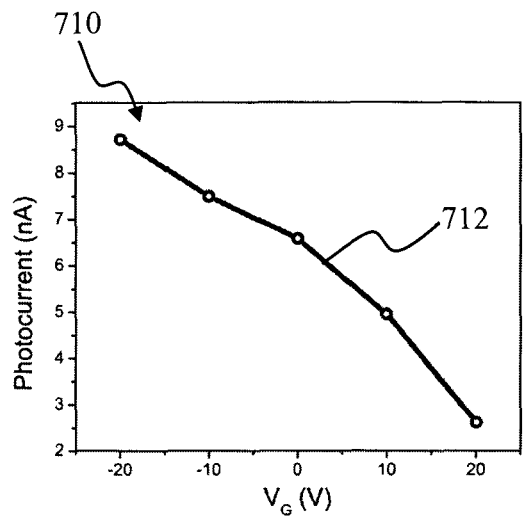
FIG. 7A illustrates a photoresponse characteristic showing gate voltage dependence of a graphene photodetector according to various embodiments.

FIG. 7A illustrates a photoresponse characteristic showing gate voltage dependence of a graphene photodetector according to various embodiments. Graph 710 shows a curve fitted line 712 for a plurality of experimental data readings. As the gate bias decreases from +20 V to −20 V, the photodetector device takes on an increasing p-type material characteristic, which can also be derived from the transport characteristics described in FIG. 3C, and the photocurrent increases. However, this is in contrast to the typical understanding that electron-hole pair generation by direct photoexcitation should be quenched, as the quasi-Fermi level moves below the valence band edge, due to fewer valence band states being filled with electrons. It is thus extrapolated by the inventors of the present disclosure that the observed inverse gate-bias dependence of the photocurrent is attributed to the effective electron-hole pair generations by the hole impact ionization assisted by the external electrical field. Such phenomena had only been previously observed in carbon nanotube systems.

Figure 7B:
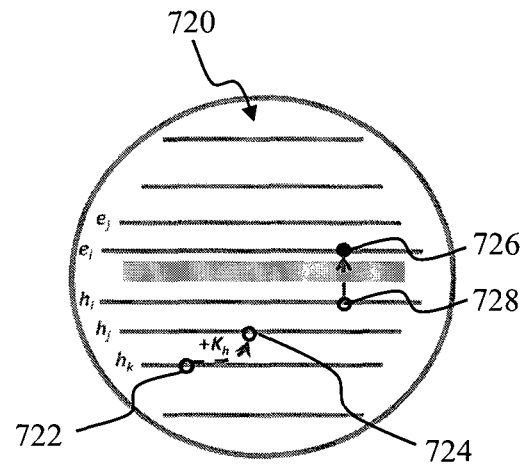
FIG. 7B illustrates an energy diagram of a processed graphene photodetector according to embodiments.

FIG. 7B illustrates an energy diagram 720 of a processed graphene photodetector according to embodiments. The rest mass energy of a photo-excited hole 722 in the high-energy level is combined with the kinetic energy to create a lower-energy hole 724 in addition to several electron-hole pairs 726, 728. This can be seen from the following equation:

$$h_k + K_h \rightarrow h_j + n \times (e+h) \quad (4)$$

where $K_h$ is the kinetic energy of holes induced by the external electric field, $h_k$ and $h_j$ indicate the higher-energy and the lower-energy holes respectively, and (e+h) refers to electron-hole pairs and n is an integer. As the gate bias decreases, which should mean that the quasi-Fermi level decreases, more holes are involved in the impact ionization process to generate more electron-hole pairs. Thus, there is a competing effect on the electron-hole pair generation between the hole impact ionization and the direct photoexcitation processes. The former is more efficient than the latter when the material is converted to be more p-type.

Figure 7C:
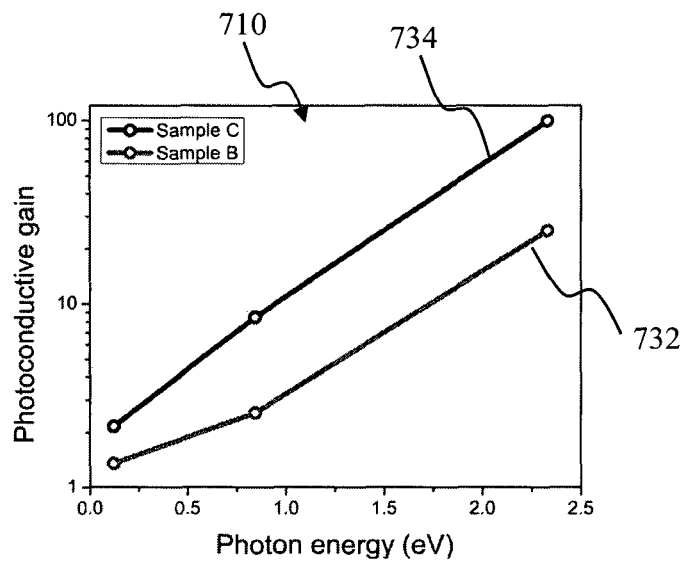
FIG. 7C illustrates the photoconductive gain spectra of graphene photodetectors according to various embodiments.

FIG. 7C illustrates the photoconductive gain spectra of graphene photodetectors according to various embodiments. Graph 730 shows the photoconductive gain spectra of the two processed devices having different average sizes of quantum dots. Photoconductive gain of Sample B is provided in curve-fitted line 732, where Sample B is a graphene photoconductor having a graphene monolayer processed with a 2 nm titanium layer in providing a GQD structure in the graphene. Photoconductive gain of Sample C is provided in curve-fitted line 734, where Sample C is a graphene photoconductor having a graphene monolayer processed with a 20 nm titanium layer in providing a GQD structure in the graphene.

For both photodetector devices, the photoconductive gain increases as the photon energy increases, arising from the increase of the carrier MEG effect. Since a photo-excited electron occupies a higher-energy level in the conduction band with a shorter wavelength illumination, of for example 532 nm according to various embodiments, it undergoes more exciton excitations when scattering into the lower energy levels within the conduction band through the impact ionization process. This leads to an increase of the conduction-band electrons as well as the captured electrons in the MGB. Therefore, the photoconductive gain increases as the photon energy increases. In addition, graph 730 shows that the sample B with a larger average GQD size, which established by equation (1) to be about 20.47 nm, has a smaller photocurrent gain than the sample C with a smaller average GQD size, which was previously established to be about 7.52 nm. When the size of the GQDs increases, the defect density decreases, as evidenced in the Raman measurement results, resulting in a fewer number of photo-excited electrons captured by the MGB states.

Theoretically, the photoconductive gain should be accurately calculated as a function of bias by a microscopic density matrix method, but such microscopic analysis requires intensive derivations and complex calculations, as well as accurate prediction of certain parameters. In the present disclosure, a simple macroscopic estimation on the calculation of the photoconductive gain based on the population dynamic analysis is utilized instead. According to various embodiments, the source-drain bias and gate voltage are set as 20 mV and 0 mV, respectively. It is then assumed that the electron populations in the conduction band and the MGB are $n_1$ and $n_2$, respectively. The recombination rate of electrons within the conduction band is R, which is then taken to be at about 1 ps, the capture rate is $\alpha$, the lifetime of trapped electrons is $\tau_1$, the transition lifetime is $\tau_t$, and the photogeneration rate is $\beta$.

It is then assumed that the number of electrons per absorbed photon due to both electron and hole impact ionizations is $\chi$. Since, in a perfect graphene sheet, the electron multiplication factor is estimated to be approximate four, it is then reasonably assumed that such an electron multiplication factor in the graphene photodetectors according to various embodiments should not be high. The hole impact ionization is not expected to be strong either, as a zero gate voltage is applied, resulting in a low hole density. In this case, it is anticipated that the factor $\chi$ induced by both electron and hole impact ionizations is not large. When the device is under illumination, the variation of the number of the electrons in the conduction band can be understood to originate from: photogeneration, carrier multiplication or carrier impact ionization, recombination and capture by the MGB. The variation of the electrons on the MGB states results from excitation to the conduction band, capture from the conduction band, and recombination with holes in the valence band. Thus, the following equations are obtained:

$$\frac{dn_1}{dt} = \chi\beta - Rn_1 - \alpha n_1 = 0 \quad (5a)$$

$$\frac{dn_2}{dt} = \alpha n_1 - \frac{n_2}{\tau_1} = 0 \quad (5b)$$

$$n_1 + n_2 = \frac{I}{e}\tau_t \quad (5c)$$

Further, the capture rate is then expressed as:

$$\alpha = \frac{\frac{I}{e\chi\beta}\tau_t R - 1}{\tau_1 - \frac{I}{e\chi\beta}\tau_t} \approx \frac{\frac{I}{e\chi\beta}\tau_t R}{\tau_1} \quad (6)$$

where the value of $\alpha$ is about $10^6$ and the quantum efficiency $\eta$ of the photo-excited electrons captured by the MGB is provided by:

$$\eta = \frac{\alpha n_1}{\beta} = \frac{\alpha}{\chi(\alpha+R)} \approx \frac{I}{e\chi\beta\tau_1}\tau_t \quad (7)$$

where the value of $\eta$ is about $10^{-6}$ after applying the appropriate values to the unknowns.

It can therefore be shown, according to various embodiments, that it is only a small portion of the photoexcited electrons which are captured by the MGB that contributes to the photoconductive gain. The photoconductive gain of the fabricated graphene photodetector. We can also calculate by using $G=\eta(\tau_{lifetime}/\tau_{transit\ time})=\eta(\tau_1/\tau_t)$, where $\tau_{lifetime}$, which is the electron lifetime in the MGB states, is about 30 s, and $\tau_{transit\ time}$, which is the free carrier holes transit time, is about 250 ns. Subsequently, a photoconductive gain G of about 120 is derived.

Figure 8A:
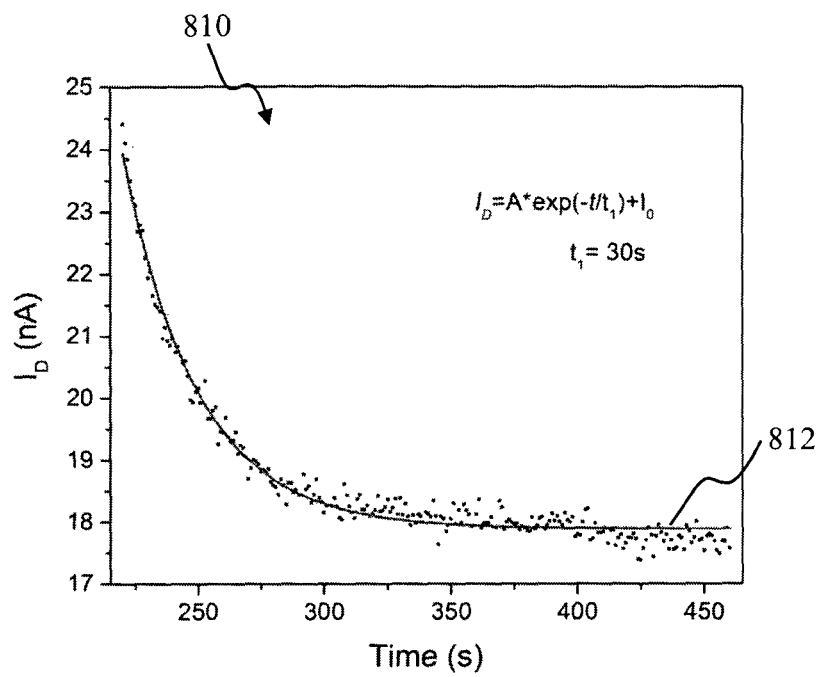
FIG. 8A illustrates a recovery curve of a graphene photodetector according to various embodiments.

FIG. 8A illustrates a recovery curve of a graphene photodetector according to various embodiments. Graph 810 shows a recovery curve $I_D$ 812 of a graphene photodetector, operating at 12K. Curve 812 is numerically curve-fitted with respect to multiple experimentally obtained measurement data points of the photocurrent decay lifetime of the processed graphene. Graph 810 is provided to substantiate the calculation of the lifetime of free carriers.

The dynamic characteristics of the processed graphene devices according to various embodiments, in response to optical illumination could be described by the following equation:

$$I_D = A\exp\left(-\frac{t}{t_1}\right) + I_0 \quad (8)$$

where $t_1$ is a constant which is considered as the lifetime of the carriers, $I_0$ is the dark current, and A is a coefficient. From the curve fitting, the lifetime of the carriers $\tau_{lifetime}$ is estimated to be about 30 s.

Figure 8B:
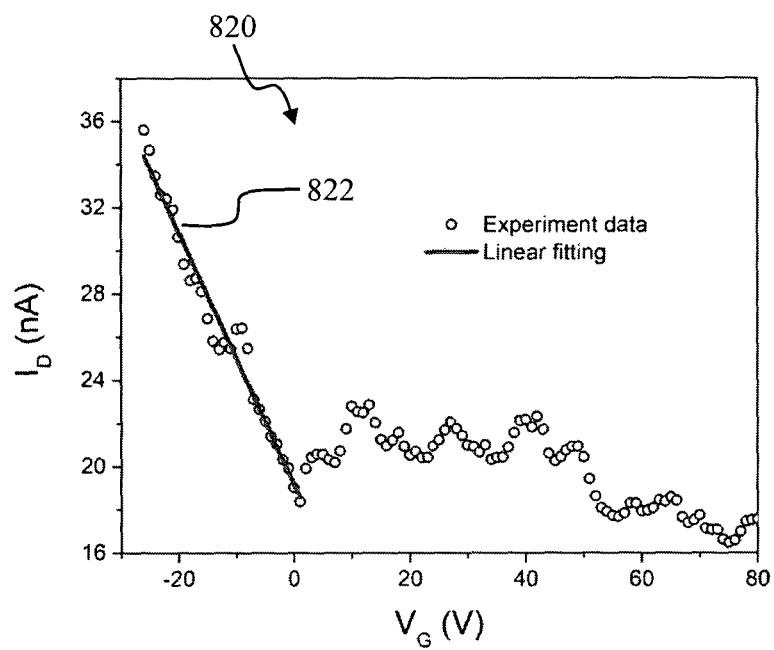
FIG. 8B illustrates a transfer curve of a graphene photodetector according to various embodiments.

FIG. 8B illustrates a transfer curve of a graphene photodetector according to various embodiments. Graph 820 shows a transfer curve 822 of a graphene photodetector, operating at 12K. Curve 822 is linearly curve-fitted with respect to multiple experimentally obtained measurement data points. Graph 820 is provided to substantiate the calculation of the transit time of free carrier holes.

To calculate the transit time, we obtain the mobility $\mu$ from the transfer curve 822 by the following equation:

$$\mu = \frac{dI_D}{dV_G}\frac{L}{W}\frac{d_{SiO_2}}{\varepsilon_{SiO_2}}\frac{1}{V_D} \quad (9)$$

where L is the channel length, W is the channel width, $d_{SiO_2}$, is the thickness of SiO2, and $\varepsilon_{SiO_2}$ is the dielectric constant of SiO2. The hole mobility $\mu$ is obtained as 8 $cm^2V^{-1}s^{-1}$. The transit time $\tau_{transit\ time}$ is thereafter obtained from $\upsilon=V_D\mu/L$ and $\tau_t=L/\upsilon=L^2/\mu V_D$, which is derived to be about 250 ns.

Returning to the calculation of the photoconductive gain G, in various embodiments, the photoconductive gain can also be obtained by $G=N_{electrons}/N_{photons}$. In embodiments, a measured photocurrent of 6.961 nA with a 5.57 nW irradiation with a visible range wavelength on the Sample C processed graphene photoconductor is utilized for calculation. A photoconductive gain of about 127 is thus obtained at a 20-mV source-drain bias and a zero gate voltage, which is in agreement with the result obtained from the above population dynamic analysis.

Figure 9A:
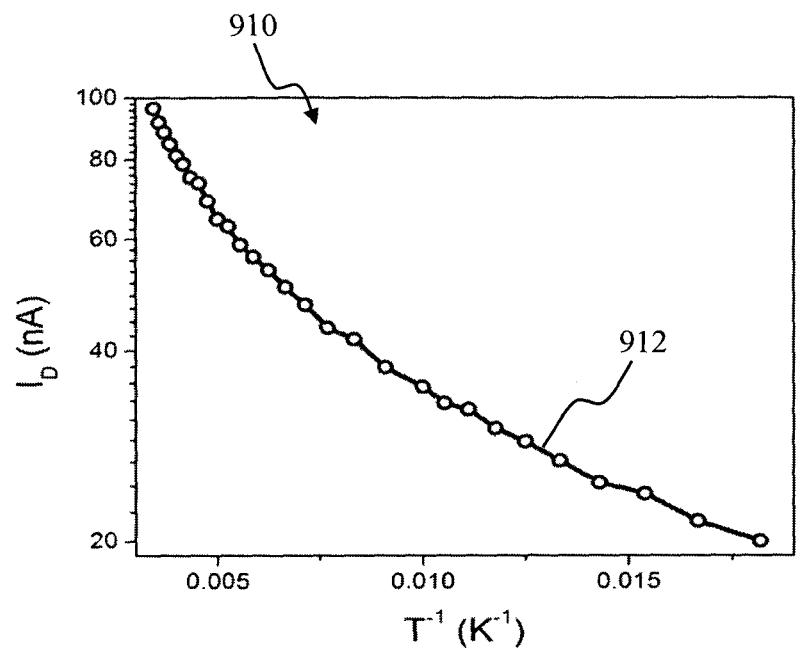
FIG. 9A provides a graph showing a curve-fit with respect to experimentally obtained photocurrent data in varying operating temperatures.
Figure 9B:
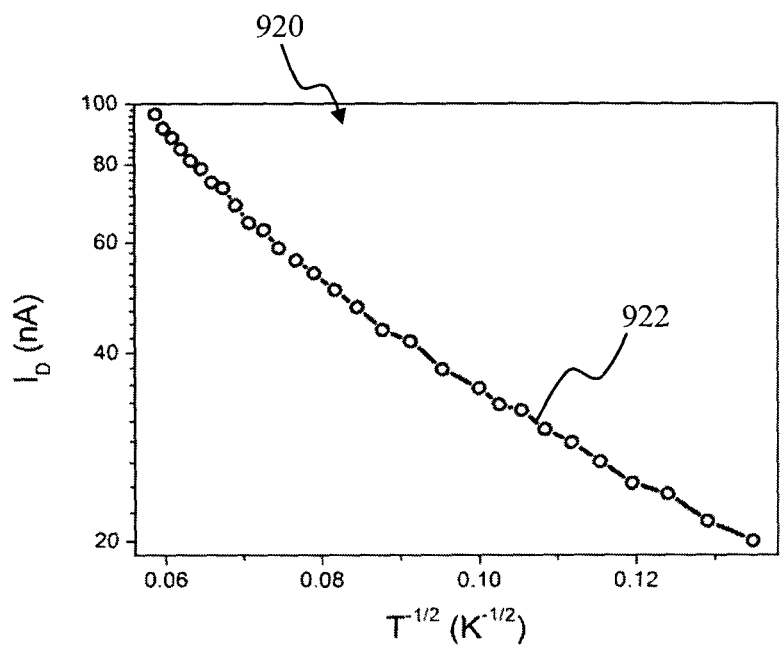
FIG. 9B provides a graph showing a curve-fit with respect to experimentally obtained photocurrent data in varying operating temperatures.

FIGS. 9A and 9B illustrate temperature dependence of a photocurrent of a graphene photodetector according to various embodiments. FIG. 9A provides a graph 910 showing a curve-fit 912 with respect to experimentally obtained photocurrent data in varying operating temperatures, the scale of 910 being in a $T^{-1}$ logarithmic scale. FIG. 9B provides a graph 920 showing a curve-fit 922 with respect to experimentally obtained photocurrent data in varying operating temperatures, the scale of 920 being in a $T^{-1/2}$ logarithmic scale.

Generally, for carrier transport across a barrier $\Delta$, a thermally activated behavior may be expected, according to the following equation:

$$I_D \propto \exp\left(-\frac{\Delta}{2kT}\right) \quad (10)$$

Where k is the Boltzmann constant, and T is the temperature. The low bias conductance G at a 20 mV source-drain bias is plotted 910 and 920 in different scales, $T^{-1}$ and $T^{-1/2}$ respectively. It can be observed that the experimental data does not fit perfectly to the curves 912 and 922, i.e. not a linear fitting, in these two scales. The best linear fitting of the temperature-dependent conductance can be obtained in a scale of $T^{-1/3}$ and is provided and described above under FIG. 4B, indicating that the variable range hopping (VRH) is the main carrier transport mechanism in the processed graphene devices according to various embodiments in the present disclosure. VRH involves consecutive hopping between two localized states and has been frequently observed in disordered systems. It obeys the following general temperature dependence:

$$I_D(T) = I_1\exp\left(-\frac{B}{T^{\frac{1}{n}}}\right) \quad (11)$$

where (n−1) is the dimensionality of the sample, $I_1$ is the coefficient, B is the hopping parameter dependent on the density of states $N(E_F)$ near the Fermi level and the localization length L of the electronic wave functions involved.

According to various embodiments, the high and broadband photoresponse of the processed graphene photodetectors can be attributed to the electron trapping in the defect MGB enhanced by the carrier impact ionization. Such discovery surprisingly runs counter to current theoretical analysis on photoresponsivity. The present disclosure now provides additional discussion and reasons that provide potential artifactual explanations of the present findings with respect to such current theories.

One theory is based on a "built-in-field" scenario. Due to the different work functions of metal and graphene, a p-n junction is usually formed close to the contacts and a maximum built-in-field moves towards the centre of the channel for up to 0.5 μm. In this scenario, the slope of the I-V curve should keep as a constant with and without irradiations, and the device should have a certain output photocurrent even when no bias is applied owing to the presence of the "built-in-field" which separates the generated electron-hole pairs. In addition, the responsivity should be at the same level around several mA/W.

However, such a theoretical scenario is in contrast to observations made on experimental operation on devices according to various embodiment. In embodiments, the processed graphene device showed that the slope of the I-V curve is changed when the photo-irradiation is switched between on and off. In both situations, the I-V curves pass through the origin point, and a high responsivity of a few A/W is obtained.

Another possible reason for improved photoresponsivity proposed in literature is the photo-thermoelectric effect. Generally, this effect only occurs in symmetric situations, either with asymmetric materials where graphene p-n junctions or junctions between different layers are constructed, or with asymmetric illumination where the illumination on the device is not uniform. In processed graphene photodetectors in various embodiments, the channel material is built only with a single layer graphene sheet, i.e. no junction exists, and the illumination is uniform. Thus, the photo-thermoelectric effect cannot explain the high photoresponse in observations made on present embodiments.

A further possible reason is that the graphene photodetector works as thermistor. To investigate the thermal effect on the graphene transport channel, the increase of the temperature caused by the light illumination is calculated based on the following equation:

$$\Delta T = \frac{P\alpha}{\kappa 2\pi h} \quad (12)$$

where κ is the thermal conductivity of the monolayer graphene, which can be about 600 W/m·K, h is the thickness of graphene, which is about 3 Å according to embodiments, P is the incident laser power, which is 5.57 nW according to embodiments, and α is the absorption coefficient, which is 2.3%. In summary, ΔT can be calculated to be in the order of 0.0042K. As shown above in FIG. 4B, the current keeps nearly the same, from 19.12 nA to 19.83 nA, when the temperature increases from 8.6 K to 15 K. Thus the calculated change of 0.0042K would be too small to cause the large photocurrent, of around 7.5 nA, as observed in experimental evaluations according to various embodiments. Therefore, none of the explanations proposed in the literature, and as discussed above, can accurately explain the observed high photoresponsivity of graphene photodetectors according to various embodiments in the present disclosure.

Conversely, in the present disclosure, and according to various embodiments, a photodetector is provided by processing a graphene sheet into a graphene quantum dot-array structure, and defect MGB electron trapping centers are formed on the boundary and surface of the GQDs and a bandgap is created due to quantum confinement. When light is incident on the graphene photodetector, electrons are excited to the conduction band, in which more secondary electrons are generated through carrier multiplication. These secondary-generated electrons can then be trapped in the MGB, and the related holes can and are re-circulated many times within the lifetime of the MGB-trapped electrons, leading to an achievement of an increased photoconductive gain.

Graphene photodetectors according to various embodiments can also cover a broad photoresponse wavelength range, from the visible, up to the mid-infrared. A mid-infrared graphene photodetector has wide applications, ranging from medicine, remote sensing, environment monitoring to telecommunications, and various others. Traditional mid-infrared HCT and QWIP photodetectors require complicated fabrication and growth of exotic single-crystalline alloys using expensive molecular beam epitaxy (MBE) or metalorganic chemical vapor deposition (MOCVD), resulting in a complex fabrication process and with high costs. The graphene photodetector according to various embodiments has a much lower cost and a lower operation voltage, and is further compatible with present CMOS electronics.

The graphene photodetector according to various embodiments displays a high responsivity over a broadband range. However, it is noticed that, in various embodiments, the operational speed is not high, and which is mainly limited by the relatively long trapped electron lifetime in the defect states caused by the chemical fabrication/etching methods according to typical methodology and used in various embodiments. The lifetime of trapped electrons in the MGB is influenced by many factors, for example defect types, trap-state density and defect trap depths, amongst others. The relatively long trapped electron lifetime can be attributed to the flood evaporation and etching of the titanium layer during fabrication. The complicated different types of defects are formed not only at the edges of the graphene quantum dot arrays but also on the quantum dot array surface, greatly increasing the defect densities and inducing extremely complex deep surface and edge defects. However, according to various embodiments, it is realized that by varying the types and the densities of defects to be processed on the graphene monolayer, the electron trap lifetime can be significantly reduced in various material systems, from tens of seconds down to a few milliseconds.

In presently available literature, it has been demonstrated that different defects in graphene can be created and engineered by several methods. It should therefore be reasonably concluded that the trapped electron lifetime in graphene can also be decreased by engineering the defect types and defect densities, for example by achieving mechanically fabricated QD edge defects with electron beam lithography (EBL) without the Ti sacrificial layer, or well-defined extended defects using a nickel supporting layer.

The drawback of decreasing the lifetime of the trapped electrons would thereby be that the responsivity of the photodetector is sacrificed. According to various embodiments, such a situation can however be compensated by increasing the relatively low carrier mobility or hole mobility in the graphene photodetectors of embodiments. As can be presently determined, the hole transport in the current approach relies on the variable range hopping effect, which possesses a relatively long carrier transport time. Further, the graphene sheet or graphene monolayer becomes a highly disordered QDs structure after processing, inducing a high defect scattering of transport holes and a long collision mean free path, thus limiting the hole mobility.

To enhance the hole mobility of the graphene nanostructure, more accurate fabrication techniques can be used, for example electron beam lithography (EBL), helium ion lithography (HIL), scanning tunneling microscope lithography and focused ions beam (FIB) to reduce the disorders and defect density. Further, other nanostructures such as nanoribbons and nanomeshes can be explored, without relying on the variable range hopping effect. According to various embodiments, bandstructure engineering of graphene can be carried out to improve the operation speed as well as the temperature performance while still maintaining a high responsivity of the proposed photodetector. It is also proposed that such a methodology can be extended to improve the performance of various graphene optoelectronic devices.

According to various embodiments, a broadband pure monolayer graphene-based photodetector can be achieved through bandstructure engineering. The demonstrated pure graphene photodetector according to embodiments shows a high responsivity, which is about two to three orders of magnitude higher than those existing in the art. Further device performance improvement can also be achieved through defect engineering and nanostructure engineering. The method of fabrication, together with the background analytical model, can also enable the development of other high performance graphene-based optoelectronic devices. It allows, for example, achieving a switching operation between electron- and hole-dominated photoconductivity in a graphene-based photodetector. Together with the ultra-high responsivity, ultra-wide band response and the simple and scalable fabrication process, the pure graphene photodetector according to various embodiments can open up exciting opportunities for future graphene-based optoelectronics.

According to embodiments, varying the types and the densities of defects can significantly reduce the electron trap lifetime in various material systems from tens of seconds down to a few milliseconds. Further, it can be demonstrated in various embodiments, that different defects in graphene can be created and engineered by several methods. According to embodiments, it is provided that the trapped electron lifetime in graphene can also be decreased by engineering the defect types and defect densities. It may be understood that by decreasing the lifetime of the trapped electrons, the responsivity of the photodetector is sacrificed. Such a situation, however, can be compensated in various embodiments by increasing the relatively low carrier mobility/hole mobility in the graphene photodetector. In embodiments, the hole transport is targeted for carrier/hole mobility improvement, and further enhanced by providing a more organized QDs structure after processing.

According to various embodiments, experimental results are obtained on the processed graphene photodetector, which show that a graphene nanoribbon structure has a much faster response speed in the millisecond range and an even higher photoresponse gain of more than 100,000. Further, by depositing a thicker layer of Ti thin film for defect processing, it can be achievable that after the fabrication, the resultant graphene quantum dots arrays are linked to form a ribbon or wire.

According to various embodiments, the photo responsivity measurements were performed in a digital deep level transient spectroscopy (DLTS, BIORAD) system with a compressor (CTI-CRYOGENICS, 8200). Three light sources, (1) visible, with a 532 nm semiconductor laser; (2) near-infrared, with a 1470 nm fiber laser; and (3) mid-infrared, with a tunable quantum cascade laser from 9.75 µm to 10.48 µm) were used to illuminate the entire graphene photodetector device. The electrical characteristics were then collected by a semiconductor device analyzer (Agilent, B1500A).

Figure 10:
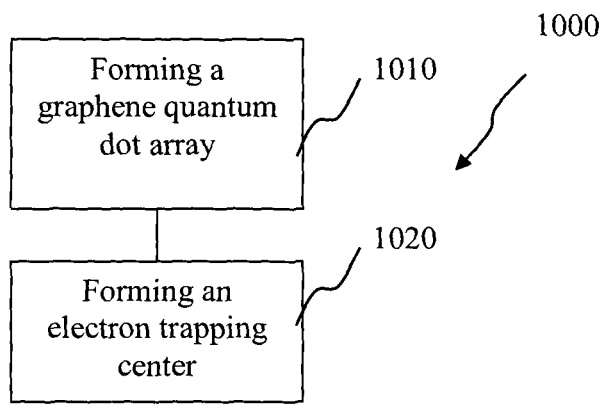
FIG. 10 illustrates a block schematic of a method of manufacturing a monolayer graphene photodetector according to an embodiment of the present disclosure.

FIG. 10 illustrates a block schematic of a method of manufacturing a monolayer graphene photodetector according to an embodiment of the present disclosure. According to an embodiment, a method 1000 of manufacturing a monolayer graphene photodetector is provided. In 1010, the method includes forming a graphene quantum dot array in a graphene monolayer. In 1020, the method includes forming an electron trapping center in the graphene quantum dot array.

In an embodiment, the graphene monolayer is a pure graphene monolayer.

In an embodiment, the method further includes forming the electron trapping center by creating a defect on a surface of the graphene quantum dot array.

In an embodiment, forming a graphene quantum dot array and forming an electron trapping center in the graphene quantum dot array includes or is accomplished through depositing a sacrificial layer on the graphene monolayer, and removing the sacrificial layer therefrom.

In an embodiment, the method further includes depositing a titanium sacrificial layer on the graphene monolayer.

In an embodiment, the method further includes depositing a sacrificial layer on the graphene monolayer through electron beam evaporation.

In an embodiment, the method further includes wet etching to remove the sacrificial layer from the graphene monolayer.

In an embodiment, the wet etching is carried out with a mixture of hydrofluoride, hydrogen peroxide and deionized water.

In an embodiment, creating the defect on the surface of the graphene quantum dot array includes creating a midgap states band in the bandstructure of the graphene monolayer.

In an embodiment, the method further includes forming a defect in the graphene quantum dot array with any one of electron beam lithography, nickel supporting layer formation, or atomic-level nanoribbons by a surface-assisted coupling method.

In an embodiment, the method further includes improving carrier mobility of the graphene quantum dot array with any one of electron beam lithography, helium ion lithography, scanning tunneling microscope lithography, or a focused ions beam.

In an embodiment, the method further includes utilizing multi-excitation generation to facilitate electron capture.

In an embodiment, the method further includes creating a bandgap in the pure graphene monolayer.

In an embodiment, the bandgap is created in a bandstructure of the graphene quantum dot array.

In an embodiment, the method further includes creating a bandgap by patterning any one of a graphene nanoribbon or nanomesh structures in the pure graphene monolayer.

In an embodiment, the method further includes patterning a graphene structure through any one of electron beam lithography, nanowire shadow mask etching block copolymer lithography or unzipping of carbon nanotubes.

In an embodiment, the method further includes fabricating the graphene quantum dot array using micromechanical exfoliation.

In an embodiment, the method further includes fabricating the graphene monolayer on a silicon-based substrate, wherein the silicon is highly p-doped.

In an embodiment, the method further includes carrying out a switching operation between electron and hole-dominated photoconductivity.

Figure 11:
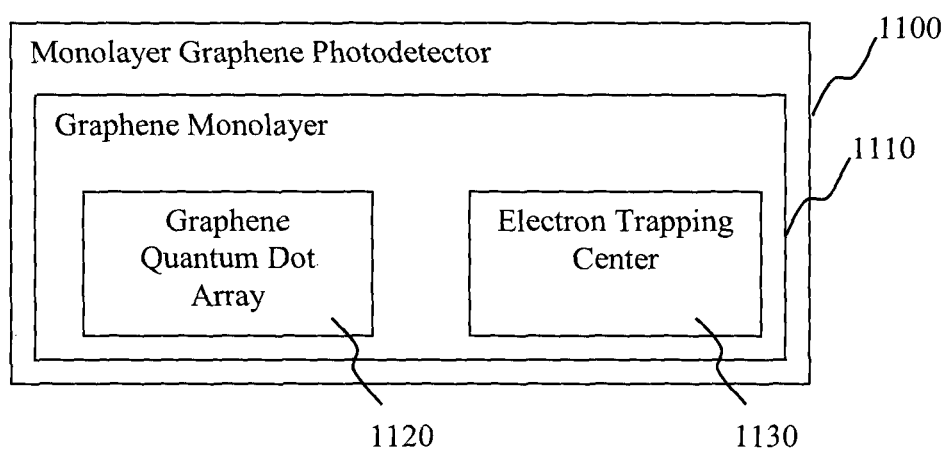
FIG. 11 illustrates a block schematic of a monolayer graphene photodetector according to an embodiment of the present disclosure.

FIG. 11 illustrates a block schematic of a monolayer graphene photodetector according to an embodiment of the present disclosure. According to an embodiment, there is provided a monolayer graphene photodetector 1100. The monolayer graphene photodetector 1100 includes a graphene monolayer 1110, and a graphene quantum dot array 1120 formed on the graphene monolayer 1110. According to an embodiment, the monolayer graphene photodetector 1100 further includes an electron trapping center 1130 formed in the graphene quantum dot array 1120.

In an embodiment, the graphene monolayer is a pure graphene monolayer.

In an embodiment, the monolayer graphene photodetector further includes a defect created on a surface of the graphene quantum dot array.

In an embodiment, the monolayer graphene photodetector further includes a sacrificial layer deposited on the graphene monolayer, the sacrificial layer removed to form the graphene quantum dot array and the electron trapping center in the graphene quantum dot array.

In an embodiment, the sacrificial layer is a titanium sacrificial layer.

In an embodiment, the monolayer graphene photodetector further a midgap states band created in the bandstructure of the graphene monolayer.

In an embodiment, the monolayer graphene photodetector further includes electron capture in the bandstructure of the graphene monolayer by utilizing multi-excitation generation.

In an embodiment, the monolayer graphene photodetector further includes a bandgap in the pure graphene monolayer.

In an embodiment, the bandgap is created in a bandstructure of the graphene quantum dot array.

In an embodiment, the monolayer graphene photodetector further includes any one of a graphene nanoribbon or nanomesh structures in the pure graphene monolayer, configured to create a bandgap.

In an embodiment, the monolayer graphene photodetector further includes a silicon-based substrate configured to receive the pure graphene monolayer, wherein the silicon is highly p-doped.

The above apparatus, method and/or system as described and illustrated in the corresponding figures, is not intended to limit an or any apparatus, method or system as according to an embodiment, and the scope of the present disclosure. The description further includes, either explicitly or implicitly, various features and advantages of the method or system according to the present disclosure, which can be encompassed within an apparatus, method or system according to the disclosure.

While embodiments of the disclosure have been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A method of manufacturing a monolayer graphene photodetector comprising:
    forming a graphene quantum dot array in a graphene monolayer; and
    forming an electron trapping center in the graphene quantum dot array, wherein:
        said photodetector has a photoresponse wavelength range from visible to mid-infrared;
        the electron trapping center is in a mid-gap band; and
        the photodetector has a photoresponse wavelength range in the entire range from visible to mid-infrared.

2. The method of claim 1, wherein the graphene monolayer is a pure graphene monolayer.

3. The method of claim 1, further comprising creating a bandgap in the graphene monolayer.

4. The method of claim 3, wherein the bandgap is created in a bandstructure of the graphene quantum dot array.

5. The method of claim 3, further comprising creating a bandgap by patterning any one of a graphene nanoribbon or nanomesh structures in the graphene monolayer.

6. The method of claim 1, further comprising forming the electron trapping center by creating a defect on a surface of the graphene quantum dot array.

7. The method of claim 6, wherein creating the defect on the surface of the graphene quantum dot array comprises creating a midgap states band in a bandstructure of the graphene monolayer.

8. The method of claim 6, further comprising forming a defect in the graphene quantum dot array with any one of electron beam lithography, nickel supporting layer formation, or atomic-level nanoribbons by a surface-assisted coupling method.

9. The method of claim 1, wherein forming the graphene quantum dot array and forming the electron trapping center in the graphene quantum dot array comprises depositing a sacrificial layer on the graphene monolayer, and removing the sacrificial layer therefrom.

10. The method of claim 9, wherein depositing the sacrificial layer includes depositing a titanium sacrificial layer on the graphene monolayer.

11. The method of claim 9, wherein depositing the sacrificial layer includes depositing the sacrificial layer on the graphene monolayer through electron beam evaporation.

12. The method of claim 9, wherein removing the sacrificial layer includes wet etching to remove the sacrificial layer from the graphene monolayer.

13. The method of claim 12, wherein the wet etching is carried out with a mixture of hydrofluoride, hydrogen peroxide and deionized water.

14. The method of claim 1, further comprising improving carrier mobility of the graphene quantum dot array with any one of electron beam lithography, helium ion lithography, scanning tunneling microscope lithography, or a focused ions beam.

15. The method of claim 1, further comprising utilizing multi-excitation generation to facilitate electron capture.

16. The method of claim 15, further comprising patterning a graphene structure in the graphene monolayer through any one of electron beam lithography, nanowire shadow mask etching block copolymer lithography or unzipping of carbon nanotubes.

17. The method of claim 1, further comprising fabricating the graphene quantum dot array using micromechanical exfoliation.

18. The method of claim 1, further comprising fabricating the graphene monolayer on a silicon-based substrate, wherein the silicon is highly p-doped.

19. The method of claim 1, further comprising carrying out a switching operation between electron and hole-dominated photoconductivity.

20. The method of claim 1, wherein said photodetector has a photoresponsivity of 0.4 A/W at a mid-infrared wavelength of 9.9 μm.

21. A monolayer graphene photodetector comprising:
    a graphene quantum dot array formed on a graphene monolayer; and
    an electron trapping center formed in the graphene quantum dot array, wherein:
        said photodetector has a photoresponse wavelength range from visible to mid-infrared;
        the electron trapping center is in a mid-gap band; and
        the photodetector has a photoresponse wavelength range in the entire range from visible to mid-infrared.

22. The monolayer graphene photodetector of claim 21, wherein said photodetector has a photoresponsivity of 0.4 A/W at a mid-infrared wavelength of 9.9 μm.

* * * * *